US005693553A

United States Patent [19]

Kashihara et al.

[11] Patent Number: 5,693,553

[45] Date of Patent: Dec. 2, 1997

[54] SEMICONDUCTOR DEVICE AND MANUFACTURING METHOD OF THE SAME

[75] Inventors: Keiichiro Kashihara; Hiromi Itoh, both of Hyogo, Japan

[73] Assignee: Mitsubishi Denki Kabushiki Kaisha, Tokyo, Japan

[21] Appl. No.: 689,761

[22] Filed: Aug. 13, 1996

Related U.S. Application Data

[62] Division of Ser. No. 526,392, Sep. 11, 1995, Pat. No. 5,567,964, which is a continuation of Ser. No. 267,180, Jun. 28, 1994, abandoned.

[30] Foreign Application Priority Data

Jun. 29, 1993 [JP] Japan .................................... 5-159206
Apr. 7, 1994 [JP] Japan .................................... 6-069774

[51] Int. Cl.[6] .................................................... H01L 21/70

[52] U.S. Cl. ............................................. 437/52; 437/919

[58] Field of Search ................................ 437/52, 60, 919, 437/47, 48; 257/295, 303, 306, 310

[56] References Cited

U.S. PATENT DOCUMENTS

| | | | |
|---|---|---|---|
| 2,791,759 | 5/1957 | Brown | 365/145 |
| 3,496,553 | 2/1970 | Freytag et al. | 365/145 |
| 3,691,535 | 9/1972 | Williams | 365/145 |
| 4,151,607 | 4/1979 | Koyanagi et al. | 365/174 |
| 4,161,038 | 7/1979 | Wu | 365/145 |
| 4,809,225 | 2/1989 | Dimmler et al. | 365/145 |
| 4,827,448 | 5/1989 | Kuo | 365/149 |
| 4,833,647 | 5/1989 | Maeda et al. | 365/182 |
| 4,849,801 | 7/1989 | Honjyo et al. | 257/306 |

(List continued on next page.)

FOREIGN PATENT DOCUMENTS

| | | |
|---|---|---|
| 55-65458A | 5/1980 | Japan . |
| 57-50446A | 3/1982 | Japan . |
| 61-82459A | 4/1986 | Japan . |
| 62-120066 | 6/1987 | Japan . |
| 62-219659 | 9/1987 | Japan . |
| 3-256358 | 11/1991 | Japan . |

OTHER PUBLICATIONS

"Fatigue and Switching in Ferroelectric Memories: Theory and Experiment," H.M. Duiker et al., J. Appl. Phys. 68(11), pp. 5783–5791.

"Endurance Properties of Ferroelectric PZT Thin Films," Moazzami et al., IEDM 90, pp. 417–420.

Taylor et al., "Acitve Compensators For Ferroelectric Circuits," *Ferroelectrics*, vol. 2, pp. 101–112 (1971).

Berlinocourt et al., "Stability of Phases in Modified Lead Zirconate With Variation in Pressure, Electric Field, Temperature and Composition," *J. Phys. Chem. Solids*, vol. 25, pp. 656–674 (1964).

Evans et al., "An Experimental 512–bit Nonvolatile Memory With Ferroelectric Storage Cell," *IEEE Journal of Solid–State Circuits*, vol. 23, No. 5, pp. 1171–1175 (1988).

Carrano et al., "Electrical and Reliability Characteristics of Lead–Zirconate–Titanate (PZT) Ferroelectric Thin Films for DRAM Applications," *IEDM*, pp. 10.2.1–10.2.4 (1980).

*Primary Examiner*—John Niebling
*Assistant Examiner*—Joni Y. Chang
*Attorney, Agent, or Firm*—Lowe, Price, LeBlanc & Becker

[57] ABSTRACT

An object of the invention is to provide a capacitor having good anti-leak characteristics and good breakdown voltage characteristics. A transfer gate transistor having source/drain regions is formed on a surface of a silicon substrate. There is provided a lower electrode layer connected to the source/drain region through a plug layer which fills a contact hole formed at an interlayer insulating film. On the lower electrode layer, there is formed a capacitor insulating layer which includes a ferroelectric layer and exposes at least a sidewall surface of the lower electrode layer. The exposed sidewall surface of the lower electrode layer is covered with a sidewall insulating layer which is formed on a top surface of the interlayer insulating film and has a sidewall spacer configuration. The lower electrode layer is covered with an upper electrode layer with the sidewall insulating layer and capacitor insulating layer therebetween.

3 Claims, 39 Drawing Sheets

10 41a 45 5 3 1 11a 13 41 W1 43a 27 23 33 35 31 25b 25a 25 23 37 21 25a 25b 25 23 27 30 30

U.S. PATENT DOCUMENTS 4,887,237 12/1989 Matsumoto .............................. 365/182
4,946,710 8/1990 Miller et al. ......................... 427/126.3
4,997,774 3/1991 Kim ........................................... 437/30
5,189,503 2/1993 Suguro et al. ........................... 257/310
5,216,572 6/1993 Larson et al. ............................ 257/295
5,335,138 8/1994 Sandhu et al. ........................... 257/310
5,366,920 11/1994 Yamamichi et al. ...................... 437/52
5,383,088 1/1995 Chapple-Sokol et al. .............. 257/306
5,498,561 3/1996 Sakuma et al. ............................ 437/52

350
Vcc
Vss
DATA INPUT
DATA OUTPUT
356
DATA-IN BUFFER
357
DATA-OUT BUFFER
358
CLOCK GENERATOR
354
COLUMN DECODER
SENSE REFRESH AMPLIFIER
MEMORY CELL ARRAY
351
355
353
ROW DECODER
A0 ~ A9
352
ROW AND COLUMN ADDRESS BUFFER
CAS
RAS
W
A0 A1 A2 A3 A4 A5 A6 A7 A8 A9
ADDRESS INPUT

LEAK CURRENT DENSITY [A/cm2]
10 0
10 -3
10 -6
10 -9
0
5
10
15
VOLTAGE [ V ]
SAMPLE (A)
Ti source supply 60 sccm
SAMPLE (B)
Ti source supply 180 sccm

SEMICONDUCTOR DEVICE AND MANUFACTURING METHOD OF THE SAME

This application is a division of application Ser. No. 08/526,392 filed Sep. 11, 1995, now U.S. Pat. No. 5,567,964 which is a continuation of application Ser. No. 08/267,180 filed Jun. 28, 1994, abandoned.

BACKGROUND OF THE INVENTION

1. Field of the Invention

The present invention relates to a semiconductor device and a method of manufacturing the same, and in particular, to a semiconductor device in which a dielectric film located between electrodes of a capacitor is made of high permittivity dielectric material as well as a method of manufacturing the same.

2. Description of the Related Art

In recent years, demands for semiconductor memory devices have been rapidly increased owing to remarkable spread of information equipments such as computers. In connection with function, such devices have been demanded that have a large scale storage capacity and can operate at a high speed. In compliance with these demands, technologies have been developed for improving degree of integration, responsiveness and reliability of the semiconductor memory devices.

DRAMs (Dynamic Random Access Memories) have been known as a kind of semiconductor memory devices which can perform random input and output of storage information. The DRAM includes a memory cell array, which is a storage region accumulating a large number of storage information, and a peripheral circuitry required for external input and output.

A structure of the DRAM will be described below.

FIG. 33 is a block diagram showing a structure of a conventional DRAM. Referring to FIG. 33, a DRAM 350 includes a memory cell array 351, a row and column address buffer 352, a row decoder 353, a column decoder 354, a sense refresh amplifier 355, a data-in buffer 356, a data-out buffer 357 and a clock generator 358.

Memory cell array 351 serves to accumulate data signals of stored information. Row and column address buffer 352 serves to receive an externally applied address buffer signal used for selecting a memory cell which forms a unit memory circuit. Row decoder 353 and column decoder 354 decode the address buffer signal to designate the memory cell. Sense refresh amplifier 355 serves to amplify and read the signal stored in the designated memory cell. Data-in buffer 356 and data-out buffer 357 serve to input and output data, respectively. Clock generator 358 serves to generate a clock signal.

In the semiconductor chip of the DRAM thus constructed, memory cell array 351 occupies a large area. Memory cell array 351 is formed of a plurality of memory cells which are disposed in a matrix form and each is operable to store the unit storage information. Thus, in general, the memory cell is formed of one MOS (Metal Oxide Semiconductor) transistor and one capacitor connected thereto. This memory cell is well known as a memory cell of one-transistor and one-capacitor type. The memory cell thus constructed has a simple structure, so that the degree of integration of the memory cell array can be improved readily and thus the memory cells have been widely used in the DRAM of a large capacity.

The memory cell of the DRAM can be classified into several types according to the structure of the capacitor. Among them, in a stacked type capacitor an opposition area of electrodes of the capacitor can be increased readily. Therefore, a sufficient capacitor capacitance can be readily ensured even if elements of the semiconductor device are miniaturized to a high extent for improving the degree of integration. By this reason, the stacked type capacitors have been widely used in accordance with high integration of the semiconductor device.

FIG. 34 shows a sectional structure of a DRAM provided with a stacked type capacitor in the prior art. Referring to FIG. 34, a silicon substrate 331 is provided at its surface with an isolating oxide film 333 for electrically isolating elements from each other. A channel stopper region 335 is formed at a region under isolating oxide film 333. Isolating oxide film 333 and channel stopper region 335 electrically isolate a portion of the surface of silicon substrate 331, at which a memory cell of the DRAM is formed. Memory cell includes one transfer gate transistor 330 and one capacitor 320.

Transfer gate transistor 330 includes a gate oxide film 321, a gate electrode 323 and a pair of source/drain regions 325. Source/drain regions 325 are formed at the surface of silicon substrate 331 with a predetermined space between each other. Source/drain regions 325 have an LDD (Lightly Doped Drain) structure. Thus, each of source/drain regions 325 is formed of a two-layer structure including a relatively lightly doped impurity region 325*a* and a relatively heavily doped impurity region 325*b*. Gate electrode 323 is formed on a region located between source/drain regions 325 with gate oxide film 321 therebetween. The surface of gate electrode 323 is covered with an insulating film 327.

There is formed an insulating film 329 which covers transfer gate transistor 330 and partially exposes the surfaces of source/drain regions 325. Capacitor 320 is in contact with one of paired source/drain regions 325 not covered by insulating film 329.

Capacitor 320 has a lower electrode layer 313, a capacitor insulating layer 315 and an upper electrode layer 317. Lower electrode layer (storage node) 313 is in contact with the surface of one of paired source/drain regions 325 and extends over insulating film 329. Capacitor insulating layer 315 mainly made of silicon oxide covers the surface of lower electrode layer 313. Upper electrode layer (cell plate) 317 covers lower electrode layer 313 with capacitor insulating layer 315 therebetween. Electric charges are accumulated in a region at which lower electrode layer 313 and upper electrode layer 317 sandwiching capacitor insulating layer 315 are opposed to each other.

An interlayer insulating film 301 covering capacitor 320 is formed over the whole surface of silicon substrate 331. Interlayer insulating film 301 is provided with a contact hole 301*a*. Contact hole 301*a* reaches the surface of the other of source/drain regions 325. A bit line 337 is formed on interlayer insulating film 301 and is in contact with source/drain region 325 through contact hole 301*a*.

Bit line 337 includes a polysilicon layer 337*a* and a tungsten silicide layer 337*b*. More specifically, polysilicon layer 337*a* and tungsten silicide layer 337*b* are successively deposited to form bit line 337. Bit line 337 is covered with an insulating film 319.

The memory cell having the stacked type capacitor shown in FIG. 34 is suitable to high integration owing to the structural features described above.

If the DRAM is integrated to a higher extent, further reduction of the memory cell size is inevitably required. In accordance with reduction of the memory cell size, a planar area occupied by the capacitor is also reduced. If the occupied planar area is reduced as described above, an area of surface region of lower electrode layer 313 decreases substantially in proportion to the ratio of planar reduction, and accordingly, the opposition area of electrodes of capacitor 320 also decreases. Thus, the amount of charges accumulated in the capacitor (i.e., the amount of charges accumulated in the memory cell of one bit) decreases. If the amount of charges accumulated in the memory cell of one bit decreases below a predetermined value, operation of the DRAM as the storage region becomes unstable, resulting in reduction of reliability.

In order to prevent instability in operation of DRAM, it is necessary to increase the capacitance of capacitor while maintaining the occupied planar area within a limited value. In order to increase the capacitor capacitance, such measures as (1) reduction of a thickness of the capacitor insulating layer and as (2) increase of the dielectric constant of the capacitor insulating layer have been studied.

In connection with the reduction of the thickness of the capacitor insulating layer at (1) above, the thickness has been generally reduced to a limit as long as a silicon oxide film is used as the capacitor insulating layer. Therefore, it is necessary to provide a capacitor of a complicated form such as a cylindrical form or a fin-like form in order to increase the capacitor capacitance using the capacitor insulating layer made of a silicon oxide film. However, the capacitor having such a complicated form requires an extremely complicated manufacturing process.

Accordingly, technologies are now being developed extensively in connection with increase of the capacitor dielectric constant at (2) above. Increase of the dielectric constant of the capacitor insulating layer can be achieved by employing the capacitor insulating layer made of material having a high dielectric constant, i.e., so-called high permittivity dielectric material. This high permittivity dielectric material generally has a dielectric constant several times to several hundred times as large as that of a silicon oxide film. Therefore, by using the capacitor insulating layer made of the high permittivity dielectric material, the capacitance can be readily increased while maintaining a simple form of the capacitor.

Examples of the material referred to as the high permittivity dielectric material include tantalum oxide ($Ta_2O_5$), lead titanate zirconate (PZT), lanthan-lead titanate zirconate (PLZT), strontium titanate (STO), barium titanate (BTO) and ST.

Description will be made on a memory cell structure of the DRAM having the capacitor employing the capacitor insulating layer made of high permittivity dielectric material, with reference to the drawings showing a conventional semiconductor device.

FIG. 35 is a cross section schematically showing a structure of the conventional semiconductor device. Referring to FIG. 35, a plurality of memory cells of a DRAM are formed at a region in a silicon substrate 431 isolated by isolating oxide films 433 and channel stopper regions 435. Each memory cell is a memory cell of one-transistor and one-capacitor type having a transfer gate transistor 430 and a capacitor 410.

Each transfer gate transistor 430 has a gate oxide film 421, a gate electrode 423 and a pair of source/drain regions 425. Source/drain regions 425 are formed at the surface of silicon substrate 431 with a predetermined space between each other. Source/drain regions 425 have an LDD (Lightly Doped Drain) structure. Thus, each of source/drain regions 425 is formed of a two-layer structure including a relatively lightly doped impurity region **425*a* and a relatively heavily doped impurity region 425*b*. Gate electrode 423 is formed on a region located between paired source/drain regions 425 with gate oxide film 421 therebetween. The surface of gate electrode 423 is covered with an insulating film 427**.

A bit line 437 extends on insulating film 427 and is in contact with one of the paired source/drain regions 425 forming the transfer gate transistor 430. Bit line 437 and transfer gate transistor 430 are covered with an interlayer insulating film 441 formed on the whole surface of silicon substrate 431. Bit line 437 thus covered with interlayer insulating film 441 is in the form of a buried bit line.

Interlayer insulating film 441 is provided with a contact hole **441*a*. Contact hole 441*a* reaches a surface of the other of paired source/drain regions 425. Contact hole 441*a* is filled with a plug layer 443*a*. Plug layer 443*a* is made of polysilicon doped with impurity (which will also be referred to as "doped polysilicon"). Capacitor 410 is formed such that it electrically connects to source/drain region 425 via plug layer 443*a***.

Capacitor 410 has a lower electrode layer 401, a capacitor insulating layer 403 and an upper electrode layer 405. Capacitor insulating layer 403 of capacitor 410 is made of the high permittivity dielectric material such as PZT, as already described. The PZT and PLZT exhibit the largest dielectric constant when layers of them are formed on platinum (Pt). Therefore, lower electrode layer 401 is made of platinum in many cases.

Lower electrode layer 401 is electrically connected to plug layer **443*a* via barrier layer 413 and extends on the surface of interlayer insulating film 401. Barrier layer 413 prevents diffusion of impurity contained in plug layer 443*a* into lower electrode layer 401, and also serves to improve adhesion between interlayer insulating film 441 and lower electrode layer 401. Capacitor insulating layer 403 made of high permittivity dielectric material such as PZT covers the surface of lower electrode layer 401. Upper electrode layer 405 covers lower electrode layer 401 with capacitor insulating layer 403 therebetween. Capacitor 410 is covered with an insulating film 445**.

Now, a method of manufacturing the conventional semiconductor device described above will be described below.

FIGS. 36 to 45 are schematic cross sections showing a process of manufacturing the conventional semiconductor device in accordance with the order of steps. Referring first to FIG. 36, isolating oxide film 433 is formed at the surface of silicon substrate 431 by, for example, an LOCOS (Local Oxidation of Silicon) method. At this step, channel stopper region 435 is formed at a region under the isolating oxide film 433.

A gate electrodes 423 is formed on the surface of silicon substrate 431 with gate oxide film 421 therebetween. Using gate electrode 423 as a mask, ion implantation is carried out to form relatively lightly doped impurity region 425. Insulating film 427 is formed to cover gate electrode 423. Using insulating film 427 as a mask, ion implantation is carried out to form relatively heavily doped impurity regions **425*b*. Lightly and heavily doped impurity regions 425*a* and 425*b* form source/drain regions 425. In this manner, transfer gate transistor 430** is formed.

Buried bit line 437 is formed such that it extends on insulating films 427 and is in contact with one of source/drain regions 425. A silicon oxide film **441*b* is formed on the whole surface of silicon substrate 431, for example, by a CVD (Chemical Vapor Deposition) method so that it covers buried bit line 437 and transfer gate transistor 430. A resist film 441***c* for forming a flat surface is formed on the surface of silicon oxide film 441*b*. Resist film 441*c* may be formed by applying an SOG (Spin On Glass) film. Then, resist film 441*c* and silicon oxide film 441*b* are etched back up to a position indicated by dotted line.

Referring to FIG. 37, this etchback completes silicon oxide film 441 having a substantially flat surface.

Referring to FIG. 38, photoresist 451 is applied to the whole surface of silicon oxide film 441, and is patterned into an intended configuration, for example, by exposure. This patterning completes resist pattern 451 having hole patterns 451 located above source/drain regions 451. Using this resist pattern 451 as a mask, anisotropic etching is effected on silicon oxide film 441. By this etching, contact hole 441*a* is formed, which partially exposes the surfaces of source/drain regions 425, in silicon oxide film 441. Thereafter, resist pattern 451 is removed.

Referring to FIG. 39, doped polysilicon film 443 having a film thickness of from 500 to 8000 Å and filling contact hole 441*a* is formed by the CVD method on the whole surface of silicon oxide film 441. Etchback is effected on doped polysilicon film 443 to expose at least the surface of silicon oxide film 441.

Referring to FIG. 40, the above etchback is carried out such that about 20% to 30% of the film thickness of doped polysilicon film 443 is over-etched for completely removing etching residue on the surface of silicon oxide film 441. This etchback completes plug layer 443*a* filling contact hole 441*a* in interlayer insulating film 441.

Referring to FIG. 41, barrier layer 413, which is made of Ti (titanium), TiN (titanium nitride) and Ti (titanium) layers and is in contact with the top surfaces of plug layers 443*a*, is formed on the whole surface of interlayer insulating film 441. Platinum layer 401 is formed on the whole surface of barrier layer 413 by the sputtering method on the whole surface of barrier layer 413.

Referring to FIG. 42, resist patterns 453 patterned into intended configurations are formed on a part of the surface of platinum layer 401. Using resist pattern 453 as a mask, platinum layer 401 and barrier layer 413 are successively etched and removed. Thereby, lower electrode layers 401 made of platinum are completed. Thereafter, resist pattern 453 is removed by ashing with oxygen plasma.

Referring to FIG. 43, this ashing exposes the top surface of lower electrode layer 401.

Referring to FIG. 44, a sputtering method is performed to form capacitor insulating layer 403 which is made of high permittivity dielectric material such as PZT and covers the surfaces of lower electrode layer 401.

Capacitor insulating film 403 made of, e.g., PZT is generally formed by the sputtering method, but may be formed by the CVD method.

Referring to FIG. 45, upper electrode layer 405 made of, e.g., platinum is formed by the sputtering method to cover lower electrode layer 401 with capacitor insulating layer 403 made of high permittivity dielectric material therebetween. Thereby, capacitor 401 including lower electrode layer 401, capacitor insulating layer 403 and upper electrode layer 405 is completed. Insulating film 445 covering capacitor 410 is formed by the CVD method.

In the above manufacturing process, the CVD method may be employed instead of the sputtering method for forming capacitor insulating layer 403 at the process shown in FIG. 45, in which case the semiconductor device shown in FIG. 46 is completed. Referring to FIG. 46, capacitor insulating layer 403 formed by the CVD method is superior in step coverage to the film or layer formed by the sputtering method.

The conventional semiconductor device using the capacitor insulating layer made of high permittivity dielectric material is constructed and manufactured as described above. Further, the capacitor capacitance can be readily increased while maintaining a simple shape of the capacitor as described above, so that such a capacitor is a promising candidate for highly integrated storage element such as 256M DRAM.

However, according to the conventional semiconductor device and the manufacturing method, capacitor insulating layer 403 is formed after patterning of lower electrode layer 401. This results in degradation of characteristics relating to the breakdown voltage between upper and lower electrode layers forming capacitor 410 as well as degradation of characteristics relating to a resistance against leak between them. This disadvantage will be described below in connection with the cases where capacitor insulating layer 403 is formed (1) by the sputtering method and (2) the CVD method.

(1) In the case of the sputtering method (i) Referring to FIG. 45, lower electrode layer 401 is formed on interlayer insulating film 441 by patterning the same into an intended configuration. Therefore, a step is formed between the top surface of lower electrode layer 401 and the top surface of interlayer insulating film 441. Capacitor insulating film 403 is formed on the surface including the step by a method such as a sputtering method of which step coverage is poor. Therefore, capacitor insulating layer 403 becomes thin at a lower end of the stepped portion (indicated at "S"). If capacitor insulating layer 403 becomes thin, a leak current flows through this thin portion indicated at "S" between lower electrode layer 401 and upper electrode layer 405 however small this portion may be, so that it is difficult to ensure a predetermined breakdown voltage. Thus, it is impossible to obtain good anti-leak characteristics and good breakdown voltage characteristics.

(ii) Referring to FIG. 47, if capacitor insulating layer 403 is formed after the patterning of lower electrode layer 401, capacitor insulating layer 403 is in contact with lower electrode layer 401 and interlayer insulating film 441.. Thus, capacitor insulating layer 403 has a portion 403*a*, which is in contact with and located on lower electrode layer 401 made of platinum, and a portion 403*b*, which is in contact with and located on interlayer insulating film 441.

In general, it has been known that perovskite structures cannot be readily obtained in a layer of high permittivity dielectric material containing lead such as PZT or PLZT, if the layer is formed on a silicon oxide film, and the perovskite structures can be readily obtained, if it is formed on a platinum film.

The inventors of the instant invention have conducted an experiment to find that PZT and PLZT can achieve better anti-leak characteristics as they contain more perovskite structures. The method and result of the experiment will be described below.

Samples (A) and (B) shown in FIG. 48 were prepared.

FIG. 48 is a schematic cross section showing a structure of the sample. Referring to FIG. 48, a sample 510 includes a silicon substrate 501, and also includes a silicon oxide film ($SiO_2$) 503, a platinum (Pt) layer 505, a film 507 made of high permittivity dielectric material (which will be referred to as a "high permittivity dielectric material film"

hereinafter) and a patterned platinum layer 509, which are successively deposited on silicon substrate 501. High permittivity dielectric material film 507 has a two-layer structure including PZT and $PbTiO_3$ layers. The upper layer of PZT has a film thickness of 150 nm and the lower layer of $PbTiO_3$ has a film thickness of 4 nm.

The sample (A) includes the lower layer made of $PbTiO_3$ which was formed in an atmosphere containing Ti (titanium) at a flow rate of 60 sccm. The sample (B) includes the lower layer made of $PbTiO_3$ which was formed in an atmosphere containing Ti (titanium) at a flow rate of 180 sccm.

FIG. 49 shows surface conditions of high permittivity dielectric material films 507 of the samples (A) and (B) observed with a scanning electron microscope (SEM). Referring to FIG. 49, white portions in the surfaces of high permittivity dielectric material films 507 represent the perovskite structures. The white portions (perovskite structures) are coarsely distributed in the sample (A), while they are densely distributed in the sample (B). Thus, the sample (B) has more perovskite structures than the sample (A). This was confirmed with the following X-ray diffraction.

In FIG. 50A and FIG. 50B show peak intensity ratios obtained by X-ray diffraction of the two samples (A) and (B), respectively. Referring to FIG. 50A and FIG. 50B abscissa gives the angle of diffraction, and the ordinate gives the intensity. In the sample (A) (in FIG. 50A), the peak intensity around 30 degrees representing the perovskite structures is small as compared with the peak intensity around 35 degrees corresponding to the structures other than the perovskite structure. Meanwhile, in the sample (B) in FIG. 50B), the peak intensity around 30 degrees representing the perovskite structures is large as compared with the peak intensity around 35 degrees corresponding to the structures other than the perovskite structure. Thus, it is confirmed that the sample (B) has more perovskite structures than the sample (A).

For the samples (A) and (B) prepared in this way, leak currents were measured. The measurement was carried in such a manner that a voltage was applied to patterned platinum layer 509 in FIG. 48, and a current value flowing through high permittivity dielectric material film 507 at that time was measured.

FIG. 51 shows the leak current values of the samples (A) and (B) measured by the above manner. Referring to FIG. 51, abscissa gives the voltage applied to patterned platinum layer 509, and ordinate gives the density (so-called leak current density) of current flowing through high permittivity dielectric material film 507. As can be seen from FIG. 51, it was found that the leak current of sample (A) was higher than that of sample (B) if the equal voltage was applied to the samples (A) and (B).

From the aforementioned results of experiment, it is found that the sample (B) having more perovskite structures generates less leak current than the sample (A) having fewer perovskite structures, and thus has better anti-leak characteristics.

By the above reason, portion 403*a* of capacitor insulating layer 403 formed on platinum layer 401 in FIG. 47 has better anti-leak characteristics because it has a relatively large number of perovskite structures. Meanwhile, portion 403*b* formed on interlayer insulating film 441 cannot have good anti-leak characteristics because it has a relatively small number of perovskite structures. Therefore, in the state where electric charges are accumulated in lower electrode layer 401 and upper electrode layer 405 and a voltage is applied to capacitor insulating layer 403, a leak path between electrodes 401 and 405 through which a leak current flows, for example, as indicated by arrow A in the figure, is likely to be formed at portion 403*b* formed on interlayer insulating film 441. Therefore, capacitor 410 cannot obtain good anti-leak characteristics and good breakdown voltage characteristics.

As can be understood from (i) and (ii) above, capacitor 410 in the prior art cannot have good anti-leak characteristics and good breakdown voltage characteristics if the capacitor insulating layer 403 is formed by the sputtering method.

(2) In the case of the CVD method

Referring to FIGS. 42 and 43, according to the conventional method of manufacturing the semiconductor device, resist pattern 453 is removed by ashing with oxygen plasma after the patterning of lower electrode layer 401. In this ashing step, portions 461 formed at the top surface of lower electrode layer 401 are damaged and contaminated by the oxygen plasma as shown in FIG. 52.

Referring to FIG. 42, resist pattern 453 is generally made of organic material and contains carbon, hydrocarbon or the like. Therefore, if resist pattern 453 is formed on lower electrode layer 401, lower electrode layer 401 absorbs carbon, hydrocarbon or the like at its surface. Therefore, it is difficult to remove completely carbon, hydrocarbon or the like at lower electrode layer 401 even if resist pattern 453 is removed by ashing. Consequently, absorbed substance 463 such as carbon and hydrocarbon remains partially at the top surface of lower electrode layer 401 shown in FIG. 52.

The capacitor insulating layer is formed by the CVD method while leaving damaged portions 461 and absorbed substance 463 at the lower electrode layer 401 as described above. The film formation by the CVD method is very sensitive to the surface state of the base film. Therefore, if the capacitor insulating layer is formed at the damaged and/or contaminated platinum surface by the CVD method, capacitor insulating layer 403 contains fewer perovskite structures than that formed on a pure platinum surface. Due to the fact that capacitor insulating layer 403 contains few perovskite structures, generation of the leak current is likely by the same reasons as above, and thus it is difficult to ensure the predetermined breakdown voltage between electrodes 401 and 405. Thus, good anti-leak characteristics and breakdown voltage characteristics cannot be obtained between lower and upper electrode layers 401 and 405.

By the above reasons, it is impossible to obtain capacitor 410 having good anti-leak characteristics and good breakdown voltage characteristics in the prior art, if capacitor insulating layer 403 is formed by the CVD method.

SUMMARY OF THE INVENTION

The present invention has been developed to overcome the above disadvantages, and its object is to obtain good anti-leakage and breakdown voltage characteristics between a lower electrode layer and an upper electrode layer forming a capacitor.

A semiconductor device according to the invention includes a silicon substrate, a conductive region, an insulating layer, a lower electrode layer, a capacitor insulating layer, a sidewall insulating layer and an upper electrode layer. The silicon substrate has a main surface. The conductive region is formed at the main surface of the semiconductor substrate. The insulating layer is formed on the main surface of the semiconductor substrate to cover the conductive region, and is provided with a hole extending from its top surface to a surface of the conductive region. The lower electrode layer is electrically connected to the conductive region through the hole, and is formed on the top surface of the insulating layer. The capacitor insulating layer contains high permittivity dielectric material, and is formed on the lower electrode layer. The sidewall insulating layer covers at least a sidewall of the lower electrode layer. The upper electrode layer is formed on the capacitor insulating layer and the sidewall insulating layer and covers the lower electrode layer.

In the semiconductor device according to the invention, the capacitor insulating layer is formed only on the lower electrode layer. Therefore, the capacitor insulating layer does not exist on a step formed by the insulating layer and the lower electrode layer. Consequently, the capacitor insulating layer has neither a portion having a reduced film thickness nor a discontinuous portion at a position above the step. Accordingly, the capacitor can maintain its function, and can have good anti-leak characteristics and good breakdown voltage characteristics.

The capacitor insulating layer is formed only on the lower electrode layer. Therefore, the capacitor insulating layer has a relatively large number of perovskite structures. This suppresses formation of a leak path between electrodes, so that the capacitor can have good anti-leak characteristics and good breakdown voltage characteristics.

According to a semiconductor device of a preferred aspect of the invention, the sidewall insulating layer is formed on the top surface of the insulating layer, and extends upward from the top surface with its width reduced continuously.

According to the semiconductor device of the preferred aspect of the invention, the sidewall insulating layer covers at least the sidewall of the lower electrode layer. The sidewall insulating layer has a portion extending upward from the insulating layer, and this upward extending portion is formed such that a lower portion has a larger width and an upper portion has a smaller width. Thus, the sidewall insulating layer has a tapered shape converging upwardly. Owing to the sidewall insulating layer, the step formed by the insulating layer and the lower electrode layer has a gradually inclined sidewall. Therefore, even if the upper electrode layer is formed by a method such as a sputtering method, which cannot achieve good step coverage, the step coverage of the capacitor insulating layer at this step can be improved. The sidewall insulating layer also serves to isolate the upper and lower electrode layers from each other.

According to a semiconductor device of another preferred aspect of the invention, the high permittivity dielectric material is paraelectric material.

According to the semiconductor device of the above preferred aspect, the capacitor insulating layer is made of the paraelectric material, so that a large amount of effective charges of the capacitor can be ensured as compared with the case where ferroelectric material is used, and film fatigue of the capacitor insulating layer can be suppressed. Since the large amount of effective charges of the capacitor can be ensured, malfunction can be suppressed when reading data stored in the capacitor. Since the film fatigue of the capacitor insulating layer is suppressed, it is possible to prevent generation of a leak current between capacitor electrodes.

According to the semiconductor device of still another preferred aspect of the invention, the sidewall insulating layer covers the sidewall and the top surface of the capacitor insulating layer, and is interposed between the top surface of the capacitor insulating layer and the upper electrode layer.

According to the semiconductor device of the above preferred aspect, since the side wall insulating layer covers the top surface of the capacitor insulating layer, damage to the top surface of the capacitor insulating layer is prevented. Therefore, it is possible to prevent increase of a leak current between the capacitor electrodes, which may be caused by the above damage.

According to the semiconductor device of a further aspect of the invention, the sidewall insulating layer is made of one type of material selected from the group consisting of $ZrO_2$, $TiO_2$ and $Ta_2O_5$.

According to the semiconductor device of the above preferred aspect of the invention, the sidewall insulating layer covering the top surface of the capacitor insulating layer is made of material such as $ZrO_2$ having a dielectric constant higher than that of a silicon nitride film. Therefore, the fact that not only the capacitor insulating layer but also the sidewall insulating layer exists between the capacitor electrodes does not cause serious reduction of the capacitor capacitance, and thus a good capacitor capacitance can be maintained.

A method of manufacturing a semiconductor device according to the invention includes the following steps.

First, a conductive region is formed at a main surface of a semiconductor substrate. A first insulating layer having a hole extending from its top surface to a surface of the conductive region is formed over the conductive region. A lower electrode layer is formed on the top surface of the first insulating layer and is electrically connected to the conductive region through the hole. A capacitor insulating layer containing high permittivity dielectric material is formed on the lower electrode layer. A mask having a predetermined configuration is formed on the capacitor insulating layer. The capacitor insulating layer and the lower electrode layer are selectively removed by patterning using a mask to expose at least a sidewall of the lower electrode layer. A second insulating layer is formed on the top surface of the first insulating layer to cover the lower electrode layer and the capacitor insulating layer which have been patterned. The second insulating layer is anisotropically etched to form a sidewall insulating layer covering the exposed surface including the sidewall of the lower electrode layer. An upper electrode layer is formed on the capacitor insulating layer and the sidewall insulating layer to cover the lower electrode layer.

According to the method of manufacturing the semiconductor device of the invention, the capacitor insulating layer is formed on the lower electrode layer before the lower electrode layer is patterned. Therefore, patterning of the lower electrode layer cause neither damage nor component such as carbon and hydrocarbon existing at and on the surface of the lower electrode layer at which the capacitor insulating layer is formed. Therefore, even if the capacitor insulating layer is formed by the CVD method, i.e., a growth method sensitive to a base surface, the capacitor insulating layer having a relatively large number of perovskite structures can be formed on the lower electrode layer. Accordingly, the capacitor having good anti-leakage characteristics and good breakdown voltage characteristics can be formed.

Before patterning the lower electrode layer, the capacitor insulating layer is formed on the lower electrode layer. Therefore, the capacitor insulating layer is not formed on a step formed by the insulating layer and the patterned lower electrode layer. Consequently, the capacitor insulating layer neither has a thin portion nor is discontinuous at a position above the step. Accordingly, the capacitor having good anti-leakage characteristics and good breakdown voltage characteristics can be formed.

Before patterning the lower electrode layer, the capacitor insulating layer is formed on the lower electrode layer. Therefore, the capacitor insulating layer is formed only on the lower electrode layer. Consequently, the capacitor insulating layer has more perovskite structures than a portion formed on the insulating layer, even if the capacitor insulating layer is formed by the sputtering method. Accordingly, formation of a leak path between electrodes is suppressed, and the capacitor having good anti-leak characteristics and good breakdown voltage characteristics can be formed.

According to the method of manufacturing the semiconductor device of a preferred aspect of the invention, the second insulating layer is anisotropically etched, whereby the sidewall insulating layer remains on a sidewall and a top surface of the capacitor insulating layer, and the upper electrode layer is formed on the sidewall insulating layer.

According to the method of manufacturing the semiconductor device of the preferred aspect of the invention, the capacitor insulating layer is not exposed from the second insulating layer when the second insulating layer is etched anisotropically, so that no damage is caused to the top surface of the capacitor insulating layer by the etching. Therefore, a leak current flowing between capacitor electrodes, which may be caused by the damage, is prevented.

The method of manufacturing the semiconductor device of still another preferred aspect of the invention further includes the step of effecting heat treatment on the lower electrode layer after formation of the sidewall insulating layer. After this heat treatment, the upper electrode layer is formed.

According to the method of manufacturing the semiconductor device of the above preferred aspect of the invention, the heat treatment is effected on the lower electrode layer, so that damage, which was introduced into the top surface of the lower electrode layer during formation of the sidewall insulating layer, is repaired. Therefore, a leak current, which may be caused by the damage, does not flow between the capacitor electrodes.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Embodiment 1

First, a structure of a semiconductor device of the first embodiment of the invention will be described below.

Figure 1:
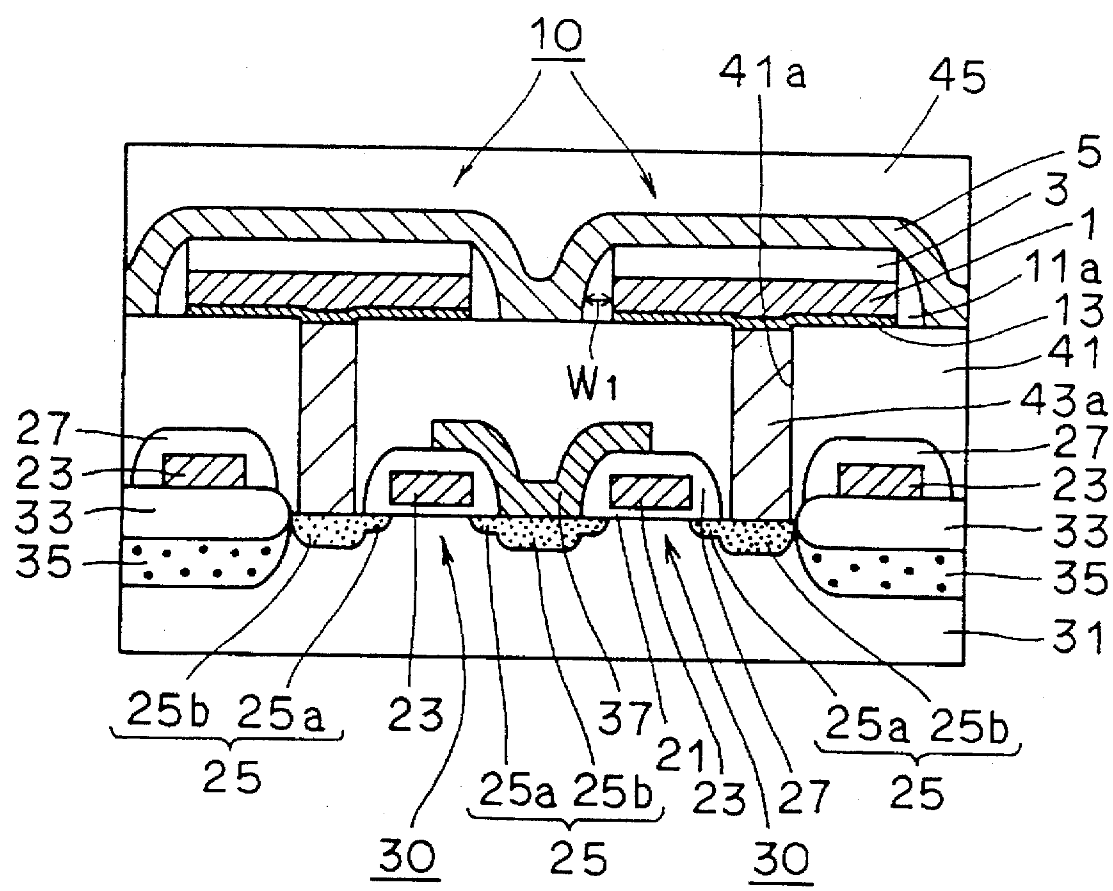
FIG. 1 is a cross section schematically showing a structure of a semiconductor device of a first embodiment of the invention.

Referring to FIG. 1, a silicon substrate 31 is provided at its surface with an isolating oxide film 33. There is also provided a channel stopper region 35 being in contact with a bottom surface of isolating oxide film 33. A plurality of transfer gate transistors 30 are formed at a portion of the surface of silicon substrate 31 electrically isolated from other portions by isolating oxide film 33 and channel stopper region 35.

Each transfer gate transistor 30 has a gate oxide film 21, a gate electrode 23 and a pair of source/drain regions 25.

Source/drain regions 25 are formed at the surface of silicon substrate 31 with a predetermined space between each other. Source/drain regions 25 have an LDD structure. Thus, each of source/drain regions 25 is formed of a two-layer structure including a relatively lightly doped impurity region 25*a* and a relatively heavily doped impurity region 25*b*. A gate electrode 23 is formed on a region located between each pair of source/drain regions 25 with a gate oxide film 21 therebetween. The surface of each gate electrode 23 is covered with an insulating film 27.

A bit line 37 extends on the surface of insulating film 27 and is in contact with one of paired source/drain regions 25. Bit line 37 and transfer gate transistors 30 are covered with a silicon oxide film ($SiO_2$) 41. Bit line 37 thus covered with interlayer insulating film 41 is in the form of a buried bit line.

Interlayer insulating film 41 is provided with a contact hole 41*a* extending from its top surface to the other of paired source/drain regions 25. Plug layer 43*a* made of doped polysilicon is formed to fill contact holes 41*a* and therefore to be in contact with the surface of source/drain regions 25. There is formed a capacitor 10 which is electrically connected to source/drain regions 25 through plug layer 43*a* and barrier layer 13.

Each barrier layer 13 has a three-layer structure formed of titanium (Ti), titanium nitride (TiN) and titanium (Ti) layers, and is in contact with plug layer 43*a*. Each of three layers forming barrier layer 13 is about 100 Å in thickness. Barrier layer 13 serves to prevent diffusion of impurity from plug layer 43*a* made of doped polysilicon into a lower electrode layer 1, and also serves to improve adhesion between interlayer insulating film 41 and lower electrode layer 1.

Capacitor 10 has lower electrode layer 1 as well as a capacitor insulating layer 3 and an upper electrode layer 19. Lower electrode layer 1 is formed on the surface of interlayer insulating film 41 with barrier layer 13 therebetween, and has a film thickness of from 500 to 700 Å. Lower electrode layer 1 is made of platinum (Pt). Capacitor insulating layer 3 is formed on the surface of lower electrode layer 1 and is made of high permittivity dielectric material such as BST, ST or PZT. The film thickness of capacitor insulating layer 3 is from about 500 to about 1000 Å (preferably from about 600 to about 800 Å) if BST is used, from about 300 to 700 Å if ST is used, and from about 1000 to about 2000 Å if PZT is used. Sidewalls of capacitor insulating layer 3 and lower electrode layer 1 are continuous to each other.

BST and ST are paraelectric materials and have dielectric constants $\epsilon$ of 350 and 250, respectively. PZT is ferroelectric material having a dielectric constant $\epsilon$ of 700.

Sidewalls 11*a* covering the sidewalls of lower electrode layer 1 and capacitor insulating layer 3 are formed on interlayer insulating film 41. The sidewall insulating layer 11*a* extends upward from the top surface of interlayer insulating film 41 with its width $W_1$ reduced continuously. Thus, the width of the upper portion of sidewall insulating layer 11*a* is smaller than that of the lower portion. An upper electrode layer 5 is formed over the lower electrode layer 1 with capacitor insulating layer 3 and sidewall insulating layer 11*a* therebetween. Upper electrode layer 5 may be made of platinum, and alternatively, may be made of doped polysilicon. An insulating film 45 is formed over capacitor 10.

Then, a method of manufacturing the semiconductor device of the embodiment will be described below.

Figure 2:
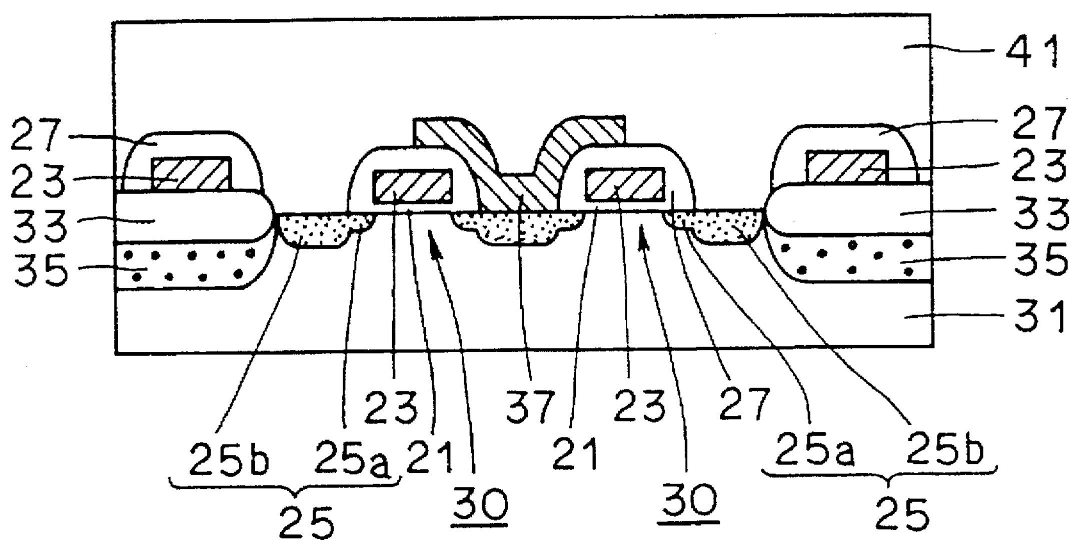
FIGS. 2 to 11 are schematic cross sections showing a process of manufacturing the semiconductor device of the first embodiment of the invention in accordance with the order of the steps.

Referring first to FIG. 2, a transfer gate transistor 30 including gate oxide film 21, gate electrode 23 and a pair of source/drain regions 25 is formed at the region of silicon substrate 31 isolated by isolating oxide film 33 and channel stopper region 35. Bit line 37 is formed such that it extends on the surface of insulating film 27 covering the surface of gate electrodes 23 and is in contact with one of source/drain regions 25. Bit line 37 is formed of, e.g., a doped polysilicon film.

A low pressure CVD method is performed to form silicon oxide film 41 on the whole surface of silicon substrate 31 to cover bit line 37 and transfer gate transistor 30. An SOG film (not shown) is applied to the surface of silicon oxide film 41 for forming a relatively flat surface. Thereafter, etchback is effected on the SOG film and silicon oxide film 41 to complete interlayer insulating film 41 having a substantially flat top surface.

Figure 3:
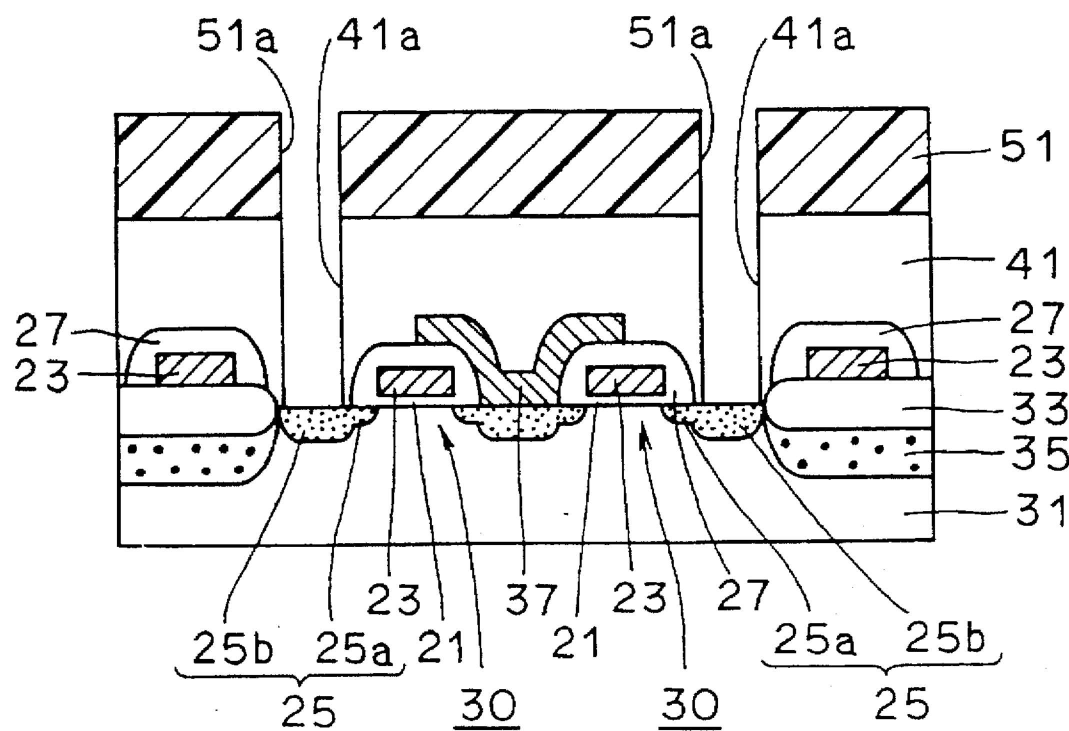

Referring to FIG. 3, photoresist 51 is applied to the whole surface of interlayer insulating film 41. Photoresist 51 is patterned, e.g., by exposure so that it has hole patterns 51*a* located above source/drain regions 25. Anisotropic etching is effected on interlayer insulating film 41 using resist pattern 51 as a mask. By this etching, contact hole 41*a* is formed, which reaches the surface of the other of source/drain regions 25, in interlayer insulating film 41. Contact hole 41*a* has an open diameter from about 0.2 to 0.6 μm. Thereafter, resist pattern 51*a* is removed.

Figure 4:
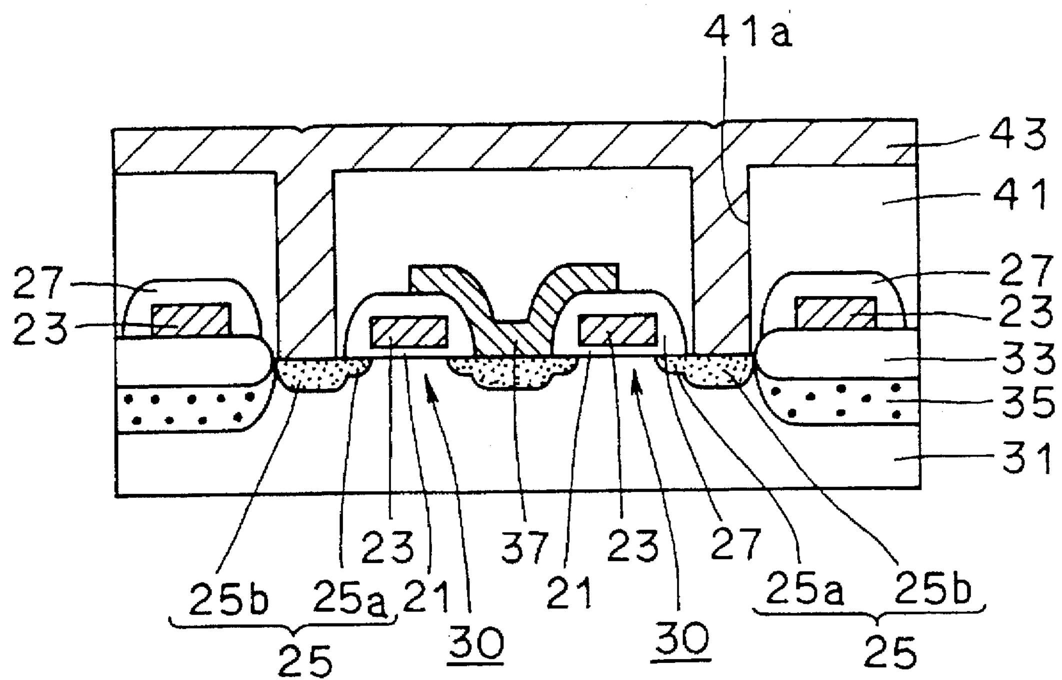

Referring to FIG. 4, the CVD method is performed to form doped polysilicon film 43 of from 3000 to 9000 Å in thickness on the whole surface of interlayer insulating film 41 to fill contact holes 41*a*. Etchback is effected on doped polysilicon film 43.

This etching is performed under the conditions that gas is $SF_6$, a flow rate of $SF_6$ is 100 sccm, a gas pressure is 500 mTorr, an RF power is 200 W, and a time is from 1 to 2 minutes. Under these conditions, the each rate of doped polysilicon film 43 is from 4000 to 6000 Å/min.

Figure 5:
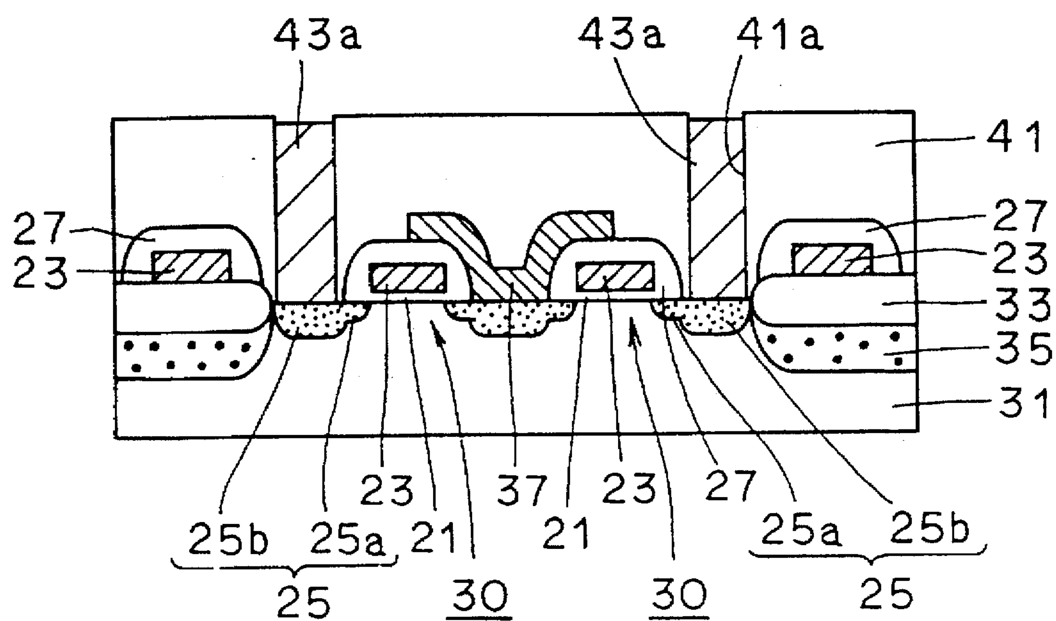

Referring to FIG. 5, the above etching removes doped polysilicon film 43 to expose at least the top surface of interlayer insulating film 41. Thereby, plug layer 43*a* which fills contact hole 41*a* and in contact with source/drain regions 25 is completed.

Figure 6:
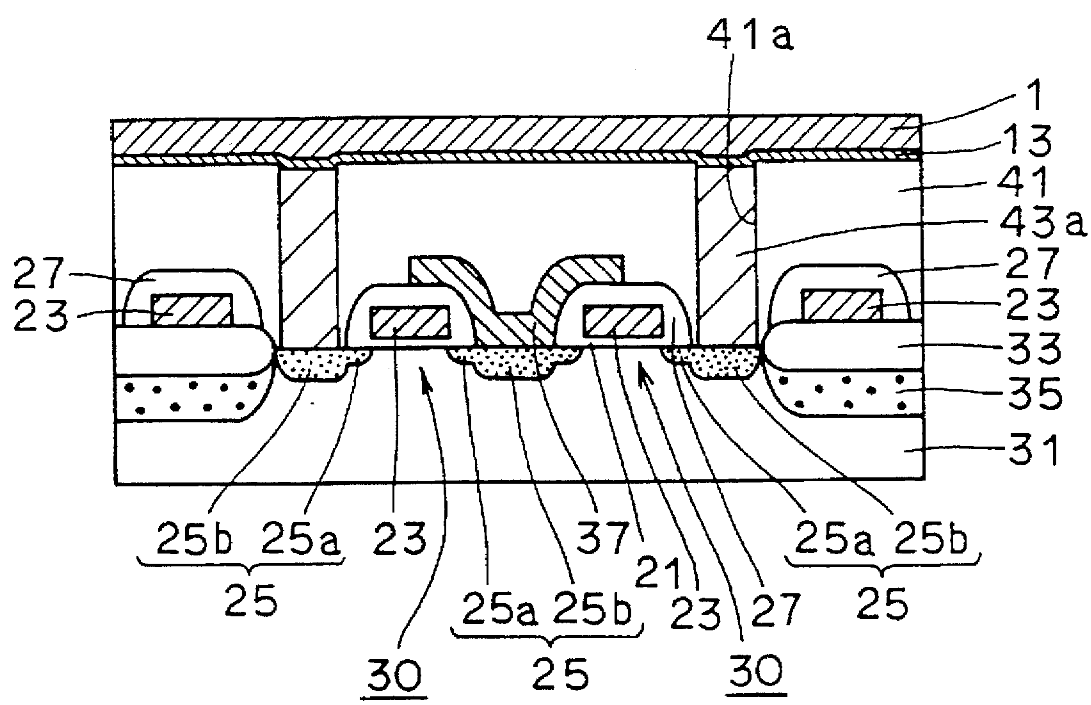

Referring to FIG. 6, three layers, i.e., the titanium layer, titanium nitride layer and titanium layer each having a thickness of about 100 Å are successively formed on the whole top surface of interlayer insulating film 41 to provide barrier layer 13 which is in contact with the top surfaces of plug layers 43*a*. Thereafter, heat treatment is performed in the atmosphere of nitrogen ($N_2$) or argon (Ar) with a temperature of 650° C. for 20 minutes so as to solicide the titanium layer at the lowermost level and interlayer insulating film 41. Platinum layer 1 of from 500 to 700 Å in thickness is formed on the whole surface of barrier layer 13, e.g., by the CVD method. Thereafter, heat treatment is performed in the atmosphere of nitrogen or argon with a temperature of 650° C. for 20 minutes so as to alloy the titanium layer at the uppermost level in barrier layer 13 and platinum layer 1 of lower electrode layer 1 with each other.

An additional platinum layer may be formed on the surface of lower electrode layer 1 made of the platinum thus alloyed.

Figure 7:
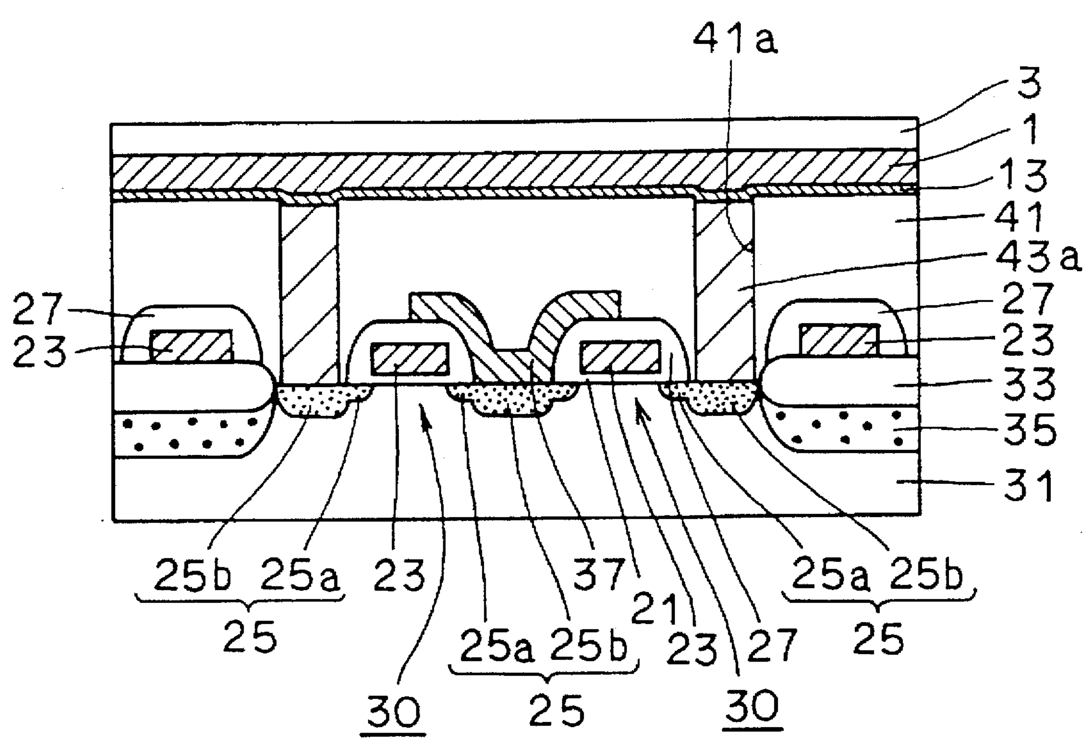

Referring to FIG. 7, a layer 3 made of high permittivity dielectric material such as BST, ST or PZT is formed on the whole surface of platinum layer 1. The film thickness of high permittivity dielectric material layer 3 is from 1000 to 2000 Å if PZT is used as the high permittivity dielectric material, from 500 to 1000 Å if BST is used, and from 300 to 700 Å if ST is used. If the high permittivity dielectric material is PZT and the sputtering method is performed for the formation of the layer, heat treatment is then effected on the high permittivity dielectric material layer 3 to form perovskite structures of PZT. This heat treatment is performed in the atmosphere of oxygen ($O_2$), and is continued, for example, for 3 hours with a temperature of 550° C., or for 30 minutes with a temperature of 650° C.

Figure 8:
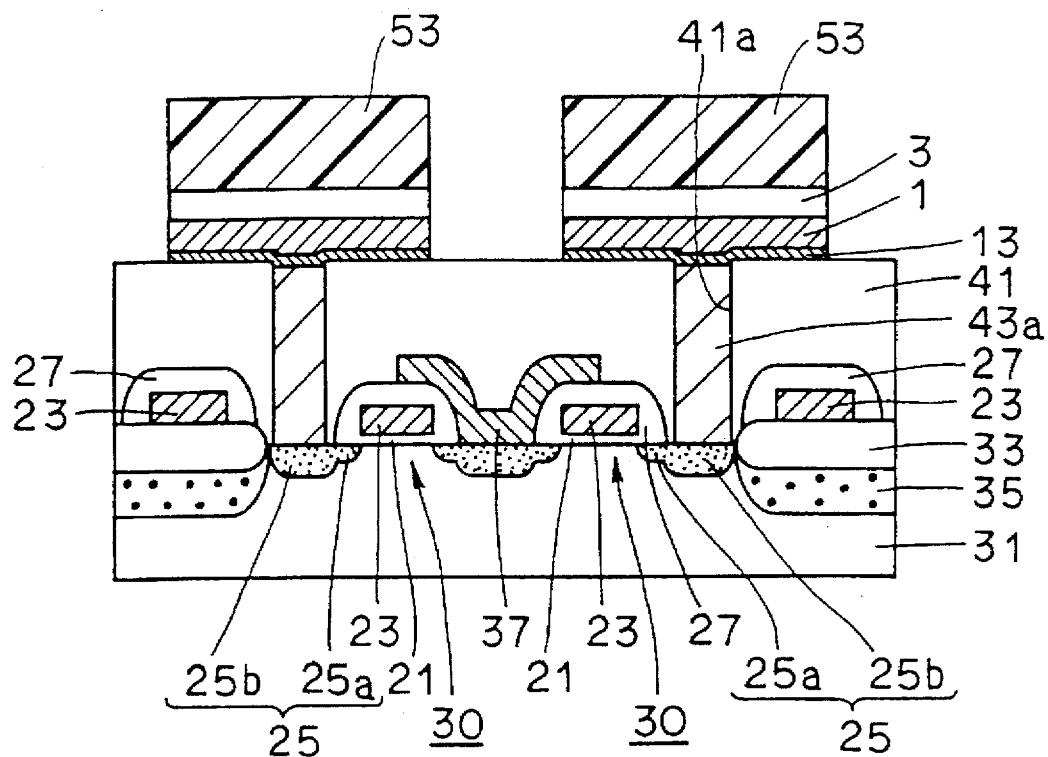

Referring to FIG. 8, resist pattern 53 having intended patterned configuration is formed on the surface of high permittivity dielectric material layer 3. Using these resist pattern 53 as a mask, anisotropic etching is successively effected on high permittivity dielectric material layer 3, platinum layer 1 and barrier layer 13 for patterning them. This patterning completes lower electrode layer 1 which is made of platinum and is electrically connected to source/drain regions 25 through barrier layer 13 and plug layer 43*a*. This patterning also completes capacitor insulating layer 3 made of high permittivity dielectric material on the surface of lower electrode layer 1. The sidewalls of lower electrode layer 1 and capacitor insulating layer 3 are substantially continuous with each other. Thereafter, resist pattern 53 is removed.

Figure 9:
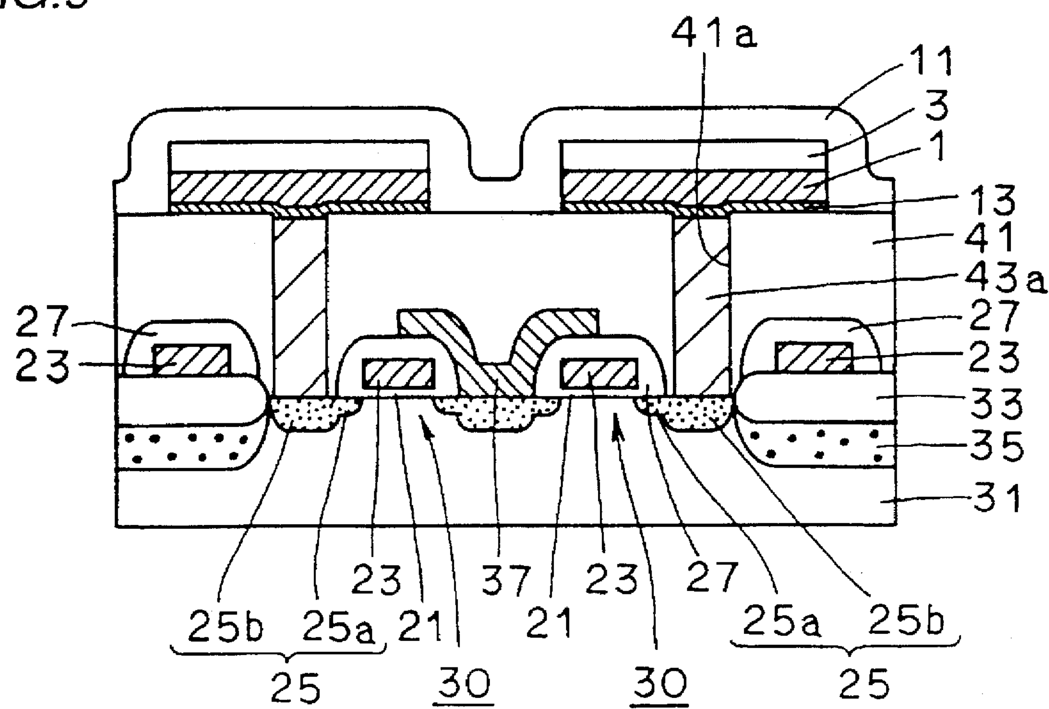

Referring to FIG. 9, an insulating film 11 made of silicon oxide or silicon nitride and having a thickness of from about 2000 to about 3000 Å is formed by the CVD method to cover the whole surfaces of lower electrode layer 1 and capacitor insulating layer 3. Anisotropic etching is effected on insulating film 11 to expose at least the surface of each capacitor insulating layer 3.

Figure 10:
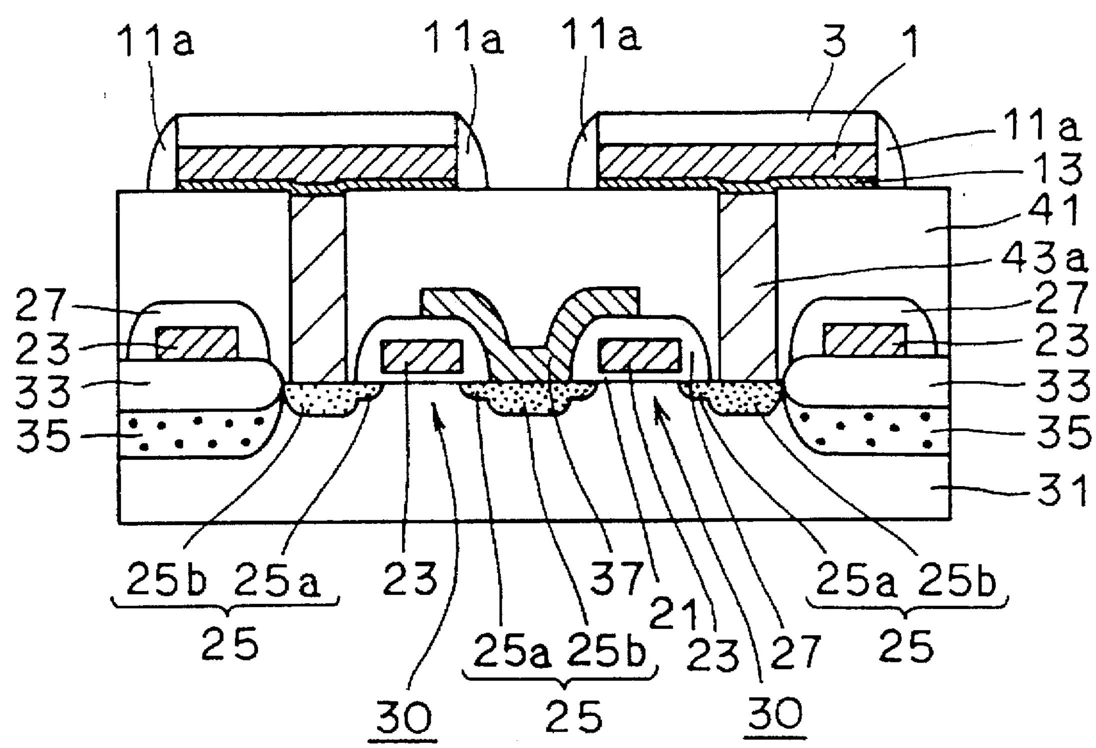

Referring to FIG. 10, this etching completes sidewall insulating layer 11*a* covering the sidewalls of lower electrode layer 1 and capacitor insulating layer 3.

Figure 11:
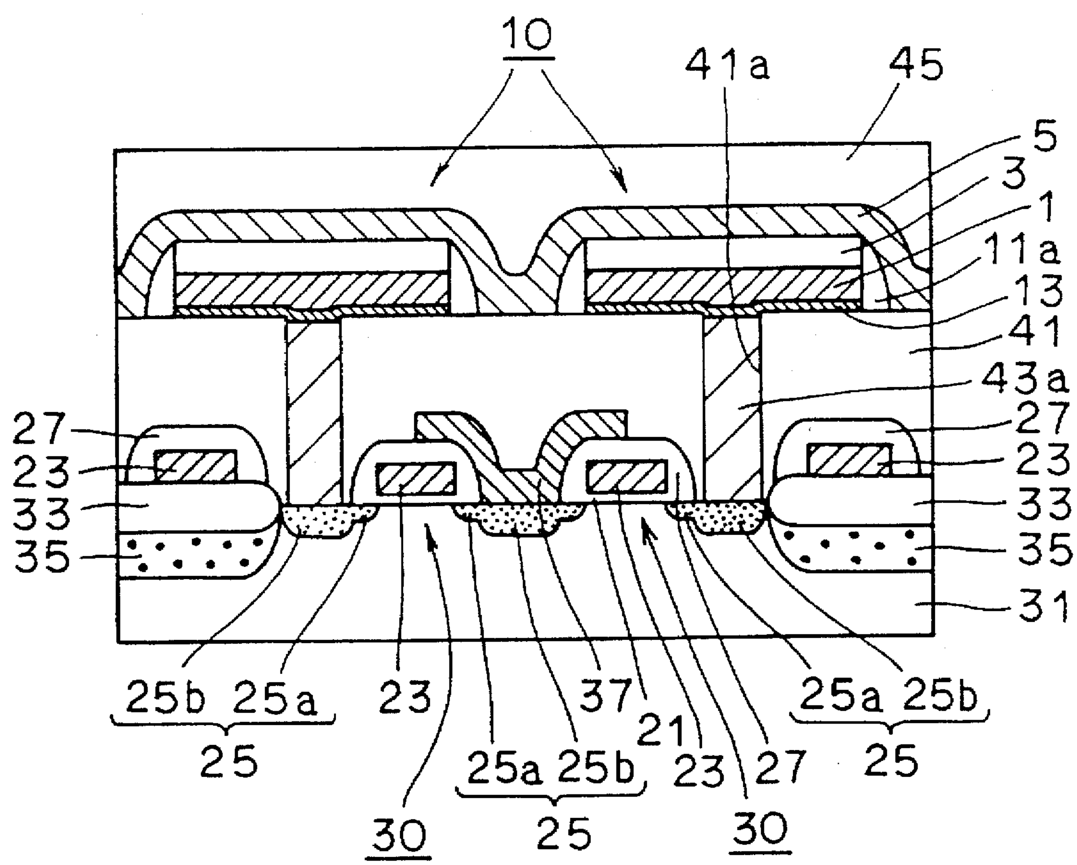

Referring to FIG. 11, upper electrode layer 5 made of platinum or doped polysilicon is formed to cover lower electrode layer 1 with capacitor insulating layer 3 and sidewall insulating layer 11*a* therebetween. Thereby, capacitor 10 including lower electrode layer 1, capacitor insulating layer 3 and upper electrode layer 5 is completed. Insulating film 45 is formed to cover capacitor 10.

In the semiconductor device of this embodiment, as shown in FIG. 1, the sidewalls of lower electrode layer 1 and capacitor insulating layer 3 are covered with sidewall insulating layer 11*a*. Sidewall insulating layer 11*a* extends upward from the top surface of interlayer insulating film 41, and this upward extending portion has such a form that the width W of the lower portion is larger than that of the upper portion. Thus, sidewall insulating layer 11*a* has an upwardly converging tapered shape, and has a smoothly inclined surface. Therefore, sidewall insulating layer 11*a* forms the smoothly inclined surface over the stepped sidewall, which is formed by interlayer insulating film 41 and capacitor insulating layer 3. Accordingly, even if upper electrode layer 5 is formed by a method such as a sputtering method of which step coverage is poor, upper electrode layer 5 can cover the stepped portion with improved step coverage.

Capacitor insulating layer 3 is formed only on lower electrode layer 1. Thus, capacitor insulating layer 3 does not exist on the stepped portion formed by the upper surfaces of interlayer insulating film 41 and lower electrode layer 1 in contrast to the prior art. At such a stepped portion, neither a thin portion nor a discontinuous portion is formed in capacitor insulating layer 3. Accordingly, the anti-leak characteristics and the breakdown voltage characteristics of capacitor 10, which may be degraded by the reduction of the film thickness of capacitor insulating layer 3, can be prevented. Also, such a situation can be prevented that the function of capacitor 10 cannot be maintained due to discontinuity of capacitor insulating layer 3. Consequently, it is possible to obtain capacitor 10 having good anti-leak characteristics and good breakdown voltage characteristics.

Further, the capacitor insulating layer 3 is formed only on the surface of lower electrode layer 1. Therefore, even if the capacitor insulating layer 3 is formed by the sputtering method, capacitor insulating layer 3 has a relatively large number of perovskite structures as compared with the case where it is formed on interlayer insulating film 41. Therefore, formation of the leak path between upper and lower electrodes 1 and 5 is suppressed, so that the capacitor having good anti-leak characteristics and good breakdown voltage characteristics can be obtained.

According to the method of manufacturing the semiconductor device of this embodiment, lower electrode layer 1 and capacitor insulating layer 3 are sequentially deposited and then are patterned at the process shown in FIGS. 7 and 8. In other words, such a conventional manufacturing process is not performed that capacitor insulating layer 3 is formed after patterning lower electrode layer 1.

If capacitor insulating layer 3 were formed by the sputtering method after lower electrode layer 1 was formed by the patterning, as was done in the prior art, capacitor insulating layer 3 would locally have a thin portion or a discontinuous portion on the stepped portion formed by interlayer insulating film 41 and lower electrode layer 1.

However, capacitor insulating layer 3 is formed prior to the patterning of lower electrode layer 1, so that capacitor insulating layer 3 is formed of platinum layer 1 having a substantially flat surface. Therefore, capacitor insulating layer 3 is not located on the stepped portion formed by interlayer insulating film 41 and lower electrode layer 1. Accordingly, it is possible to prevent degradation of the anti-leak characteristics and breakdown voltage characteristics of capacitor 10 which may be caused by reduction of the film thickness or discontinuity of capacitor insulating layer 3. Consequently, the capacitor 10 having good anti-leak characteristics and breakdown voltage characteristics can be manufactured.

In the prior art, capacitor insulating layer 3 is formed by the sputtering method after the patterning of lower electrode layer 1, so that capacitor insulating layer 3 has a portion formed on interlayer insulating film 41. The portion formed on interlayer insulating film 41 has fewer perovskite structures than the portion formed on lower electrode layer 1. Therefore, it is likely that a leak path is generated between upper and lower electrodes 1 and 5, resulting in degradation of anti-leak characteristics and others of capacitor 410.

In this embodiment, however, capacitor insulating layer 3 is formed before the patterning of lower electrode layer 1, so that capacitor insulating layer 3 is formed only on lower electrode layer 1, and is not formed on the interlayer insulating film 41. Therefore, capacitor insulating layer 3 has such a film quality that it contains a relatively large number of perovskite structures as a whole, and formation of a leak path between upper and lower electrodes 1 and 5 is suppressed. Accordingly, capacitor 10 having good anti-leak characteristics and breakdown voltage characteristics can be manufactured.

In the prior art, the patterning of lower electrode layer 1 may cause damage at the surface of lower electrode layer 1 due to oxygen plasma and/or absorption of components such as carbon contained in the resist. Therefore, if capacitor insulating layer 3 is formed by the method such as the CVD method which is sensitive to the surface state of the base layer, perovskite structures cannot be readily obtained in capacitor insulating layer 3. This results in degradation of anti-leak characteristics and breakdown voltage characteristics.

In the embodiment, however, capacitor insulating layer 3 is formed prior to the patterning of lower electrode layer 1, so that the surface of lower electrode layer 1 is not damaged, and it does not absorb the components in the resist. Therefore, capacitor insulating layer 3 having a relatively large number of perovskite structures can be formed on lower electrode layer 1 by the CVD method. Therefore, capacitor 10 having good anti-leak characteristics and good breakdown voltage characteristics can be manufactured.

Figure 12:
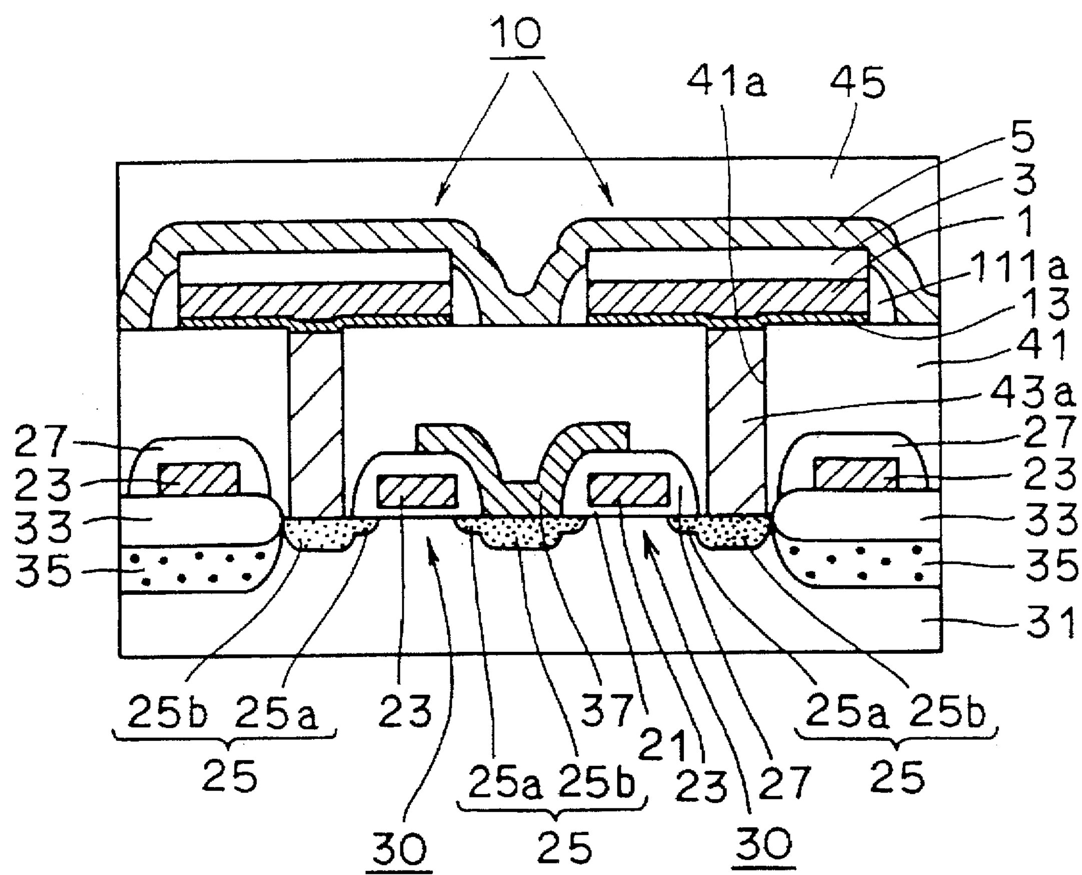
FIG. 12 is a schematic cross section showing a structure of the semiconductor device of the first embodiment of the invention provided with a sidewall insulating film having a modified configuration.

In this embodiment, sidewall insulating layer 11*a* has a height nearly equal to the sum of thicknesses of barrier layer 13, lower electrode layer 1 and capacitor insulating layer 3 as shown in FIG. 1. However, sidewall insulating layer 11*a* is required only to cover at least the sidewall of lower electrode layer 1, so that, as shown in FIG. 12, a sidewall insulating layer 111*a* may have a height smaller than the sum of film thicknesses of barrier layer 13, lower electrode layer 1 and upper electrode layer 3.

In this embodiment, sidewall insulating layer 11*a* shown in FIGS. 9 and 10 is formed by over-etching 20 to 30% of silicon nitride film 11 formed on the whole surface. This over-etching may damage the top surface of capacitor insulating layer 3. Due to the damage to the capacitor insulating layer 3, a leak current may generate when a voltage is applied across capacitor electrodes 1 and 5. Therefore, it may be necessary to prevent the possible damage to capacitor insulating layer 3 when forming sidewall insulating layer 11*a*. For this purpose, the following two measures, which will be described below as embodiments 2 and 3, may be employed.

Embodiment 2

When sidewall insulating layer 11*a* is made of a silicon nitride film or a silicon oxide film, annealing may be effected after sidewall insulating layer 11*a* is formed as shown in FIG. 10. This annealing process is specifically performed by lamp annealing, for example, at a temperature of 500° C. in an atmosphere of oxygen ($O_2$) for 10 to 30 seconds. Alternatively, furnace annealing may be performed at a temperature from 500° to 600° C. in the oxygen atmosphere for 30 minutes. Thereby, damage applied to capacitor insulating layer 3 is repaired, and the leak current is not generated even if a voltage is applied across capacitor electrodes 1 and 5.

Embodiment 3

The following measures may be employed if sidewall insulating layer 11*a* is made of $ZrO_2$ (zirconium oxide), $TiO_2$ (titanium oxide) or $Ta_2O_5$ (tantalum oxide).

Figure 13:
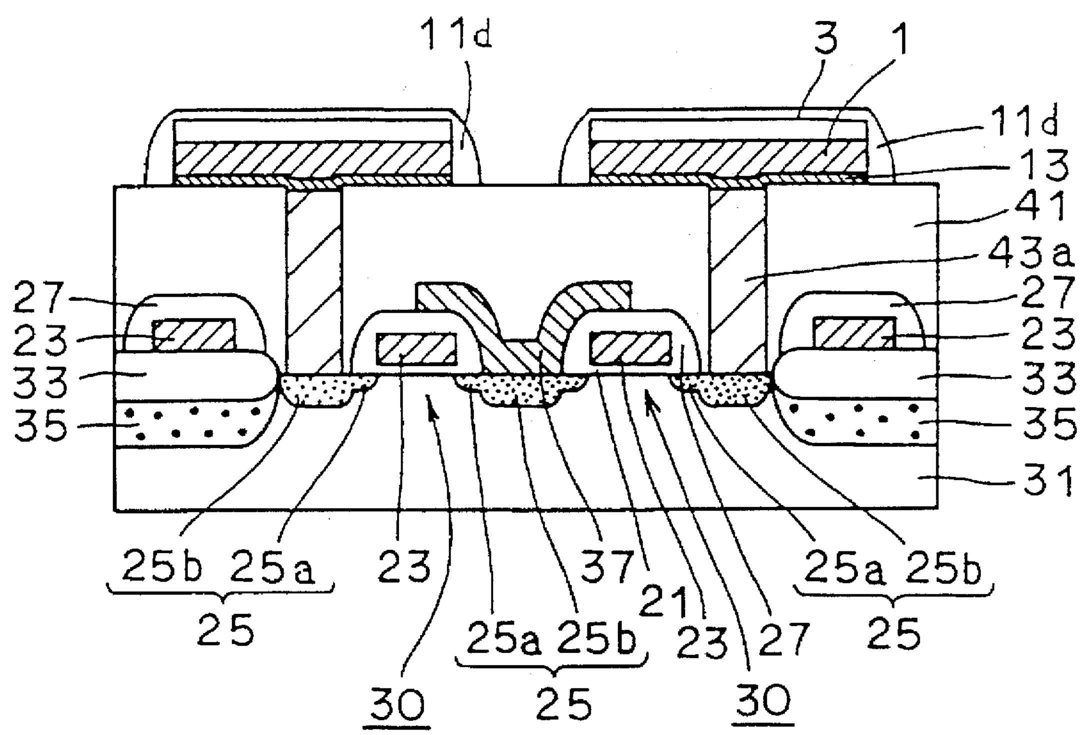
FIGS. 13 and 14 are schematic cross sections showing a process of manufacturing the semiconductor device of a third embodiment of the invention in accordance with the order of the steps.

Referring to FIG. 13, a layer of $ZrO_2$, $TiO_2$ or $Ta_2O_5$ is formed on the whole surface after lower electrode layer 1 and capacitor insulating layer 3 are formed. Anisotropic etching is effected on the whole surface of the layer of $ZrO_2$ or the like to such an extent that the surface of capacitor insulating layer 3 is not exposed. Thereby, sidewall insulating layers 11*d* of $ZrO_2$ are formed to cover the sidewalls of lower electrode layers 1 as well as the top surfaces of capacitor insulating layers 3.

Figure 14:
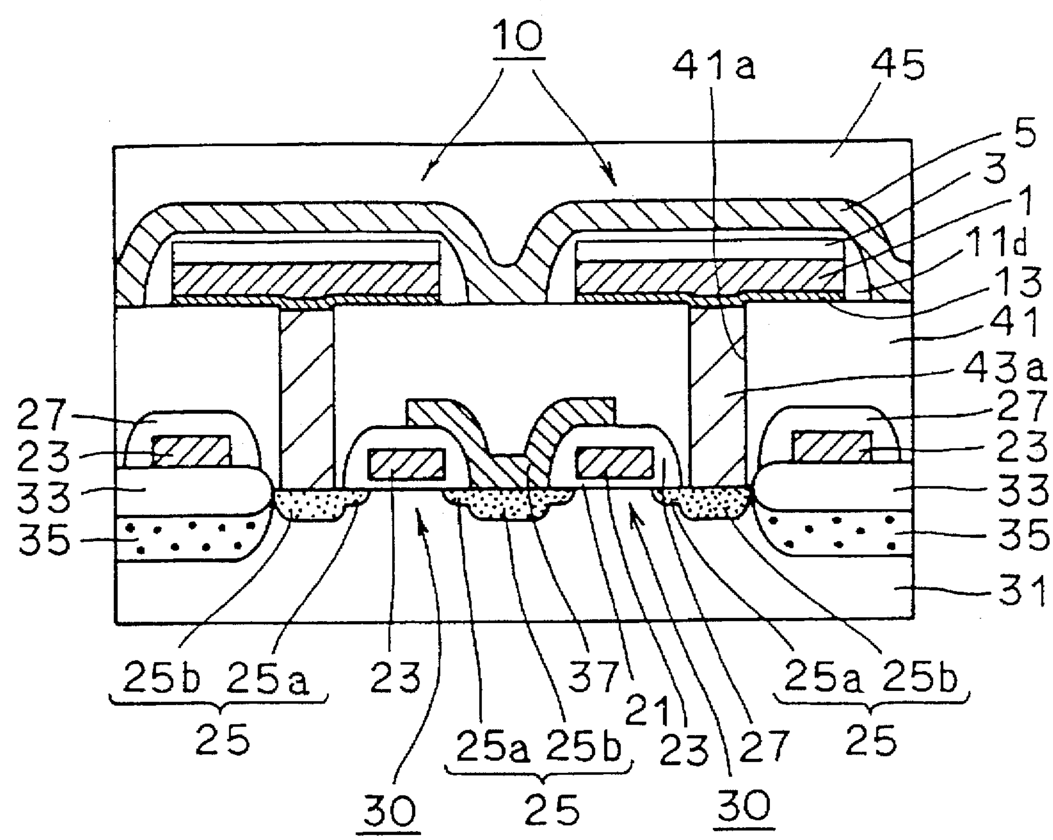

Thereafter, the process similar to that of the first embodiment is performed to obtain the structure shown in FIG. 14.

According to the method of this embodiment, when sidewall insulating layer 11*d* is formed, etching is performed to such an extent that the surface of capacitor insulating layer 3 is not exposed. Therefore, the top surface of capacitor insulating layer 3 is not damaged by etching, and thereby, generation of the leak current is suppressed even if a voltage is applied across capacitor electrodes 1 and 5.

The dielectric constants $\epsilon$ of $ZrO_2$, $TiO_2$ and $Ta_2O_5$ which can be selected as the material of sidewall insulating layer 11*d* are from 12.5 to 18.0, 20.0, and from 85.8 to 170.0, respectively, and are higher that those of the silicon oxide film ($\epsilon$=3.9) and silicon nitride film ($\epsilon$=7.4). Therefore, by leaving the sidewall insulating layer 11*d* to cover the top surface of capacitor insulating layer 3, a capacitance of the capacitor can be kept high even if the sidewall insulating layer 11*d* exists between the capacitor electrodes 1 and 5.

Meanwhile, if the sidewall insulating layer 11*d* formed of a silicon oxide film or a silicon nitride film were left on the top surface of capacitor insulating layer 3, it would be difficult to maintain a high capacitor capacitance because the silicon nitride film and silicon oxide film have a relatively low dielectric constant.

As described above, employment of $ZrO_2$, $TiO_2$ or $Ta_2O_5$ as the material of sidewall insulating layer 11*d* can achieve an advantage that the capacitor capacitance can be maintained high.

Modification 1

According to the semiconductor device and the method of manufacturing the same of the first embodiment already described, it is possible to provide the capacitor having good anti-leak characteristics and good breakdown voltage characteristics. According to the manufacturing method described above, however, lower electrode layer 1 and upper electrode layer 5 may possibly be electrically connected together. This will be described below in detailed.

Figure 15:
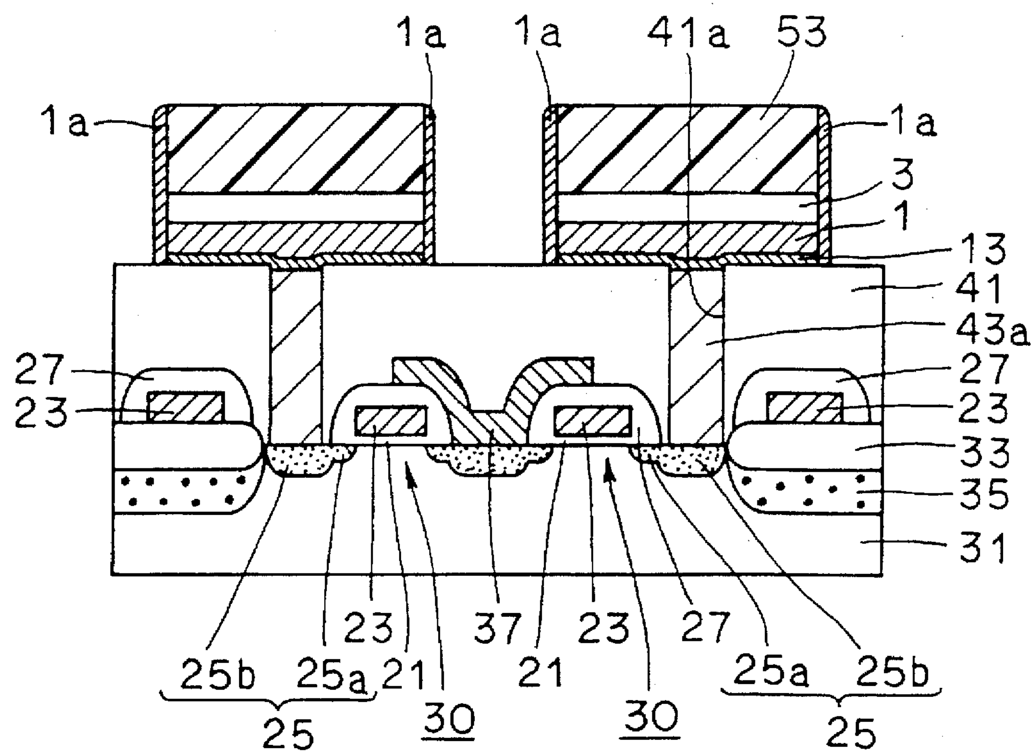
FIGS. 15 to 18 are schematic cross sections showing a process of electrically connecting a lower electrode layer and an upper electrode layer in accordance with the order of the steps.

According to the manufacturing method of the first embodiment, lower electrode layer 1 is patterned using resist pattern 53 as a mask at the step shown in FIG. 8. While etching the platinum of lower electrode layer 1, the platinum, which was once removed by the etching, may adhere again to the sidewalls of lower electrode layer 1, capacitor insulating layer 3 and resist pattern 53 as shown in FIG. 15. Resist pattern 53 will be removed while maintaining this state.

Figure 16:
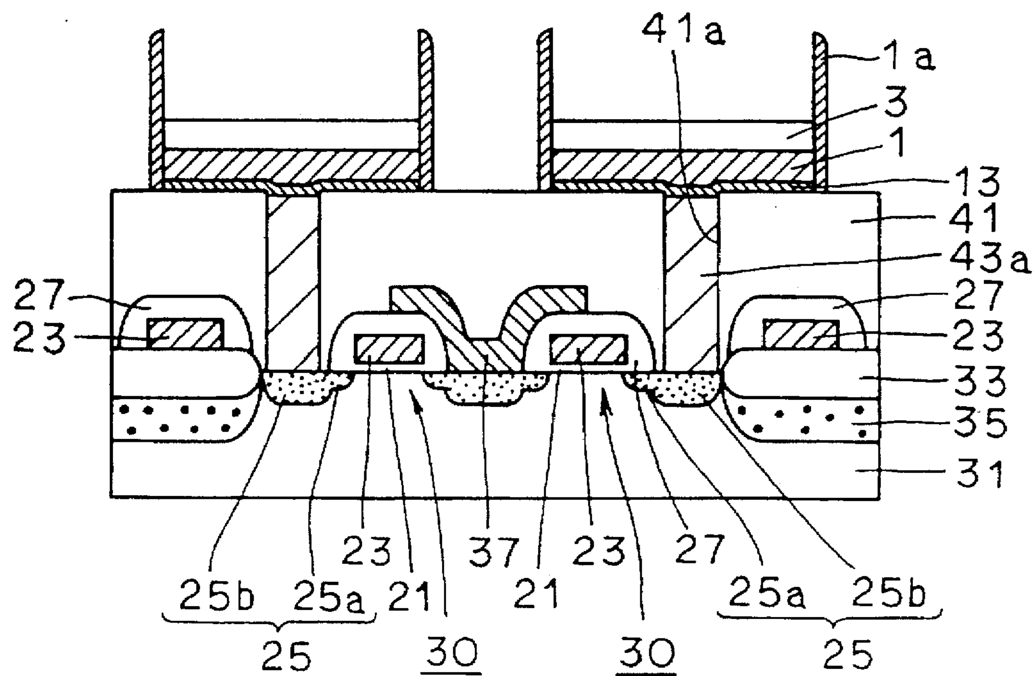

Referring to FIG. 16, after the resist pattern 53 is removed, there remains a platinum layer la which is in contact with the sidewall of lower electrode layer 1 and extends upward. Platinum layer la can be physically and mechanically removed so that it may have a surface continuous with the top surface of capacitor insulating layer 3, and specifically, can be removed, for example, by water jet.

Figure 17:
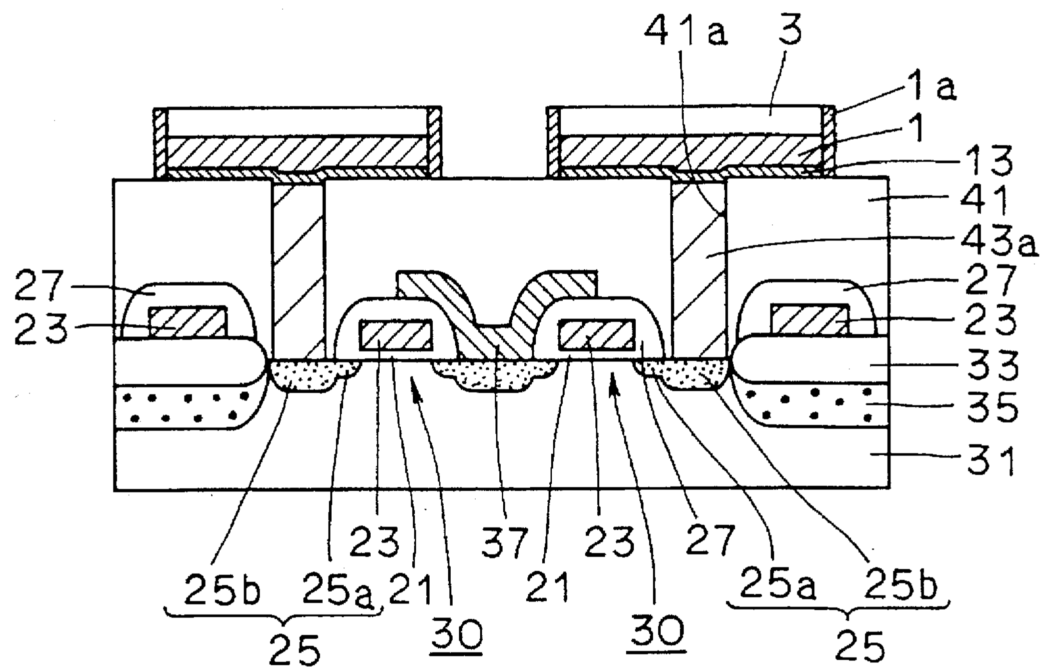

Referring to FIG. 17, by the aforementioned physical and mechanical process, an upper portion of platinum layer 1*a* extending above the top surface of capacitor insulating layer 3 is bent and cut off, and the lower portion is left connected to the sidewall of lower electrode layer 1.

Figure 18:
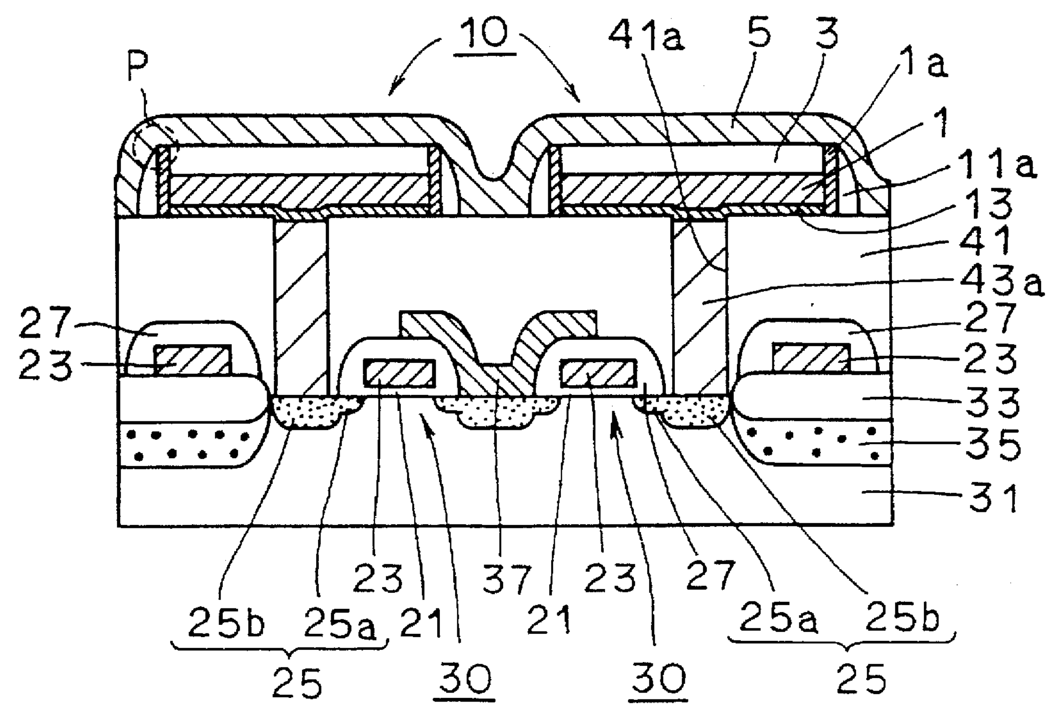

Referring to FIG. 18, if capacitor 10 were formed by subsequent steps similarly to the embodiment already described with the residual platinum layer 1*a* being left connected to the sidewall of lower electrode layer 1, residual platinum layer 1*a* would connect lower electrode layer 1 to upper electrode layer 5. In spite of the fact that sidewall insulating layer 11*a* is disposed on the sidewall of lower electrode layer 1 for isolating the same from upper electrode layer 5, upper electrode layer 1 and lower electrode layer 5 would be electrically connected together through a portion P. In this case, capacitor 10 cannot maintain its function, and the memory cell cannot perform storing and erasing operations.

The first modification of the invention, which will be described below, can overcome the disadvantage of possible electrical connection between the lower electrode layer 1 and upper electrode layer 5.

Figure 19:
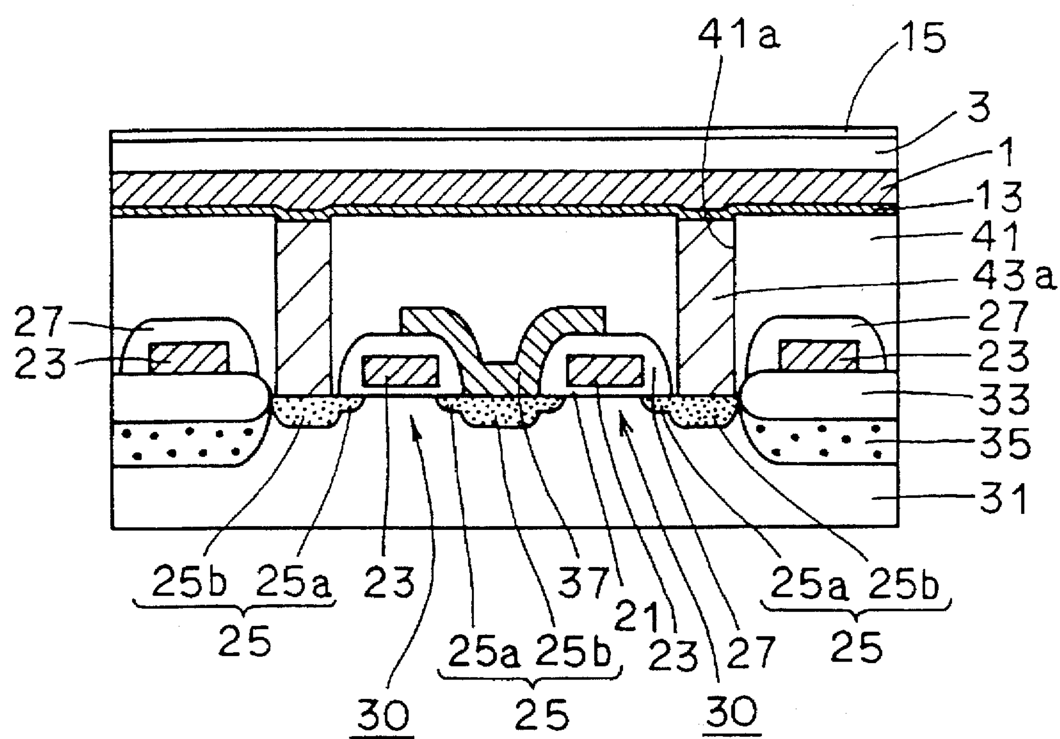
FIGS. 19 to 24 are schematic cross sections showing a process of manufacturing the semiconductor device of a first modification of the invention in accordance with the order of the steps.

Referring first to FIG. 19, steps prior to the step in FIG. 19 are the substantially same as those already described with reference to FIG. 7. Thereafter, silicon oxide film 15 is formed on the whole surface of capacitor insulating layer 3.

Figure 20:
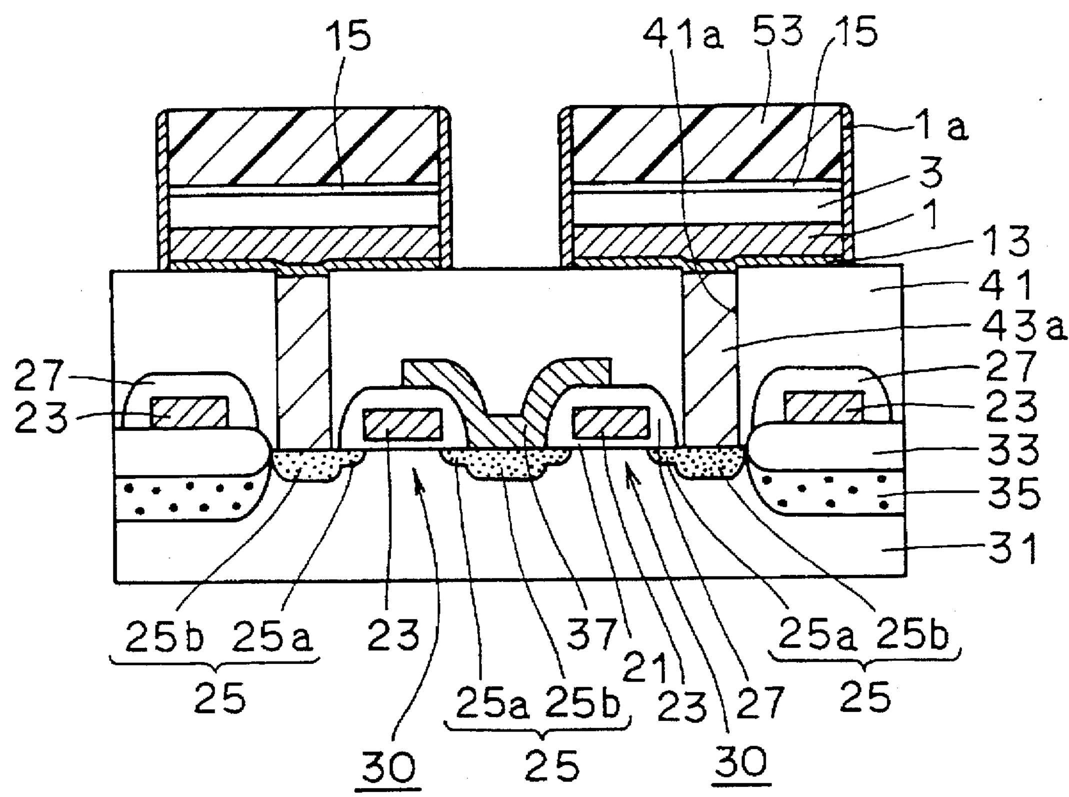

Referring to FIG. 20, resist pattern 53 having an intended patterned configuration is formed on the surface of silicon oxide film 15. Using resist pattern 53 as a mask, etching is effected to successively pattern silicon oxide film 15, capacitor insulating layer 3, platinum layer 1 and barrier layer 13. By this etching, and particularly, by the patterning of platinum layer 1, sidewall platinum layer 1*a* is formed on the sidewalls of resist pattern 53, silicon oxide film 15, capacitor insulating layer 3 and platinum layer 1 similarly to the process already described. Thereafter, resist pattern 53 is removed.

Figure 21:
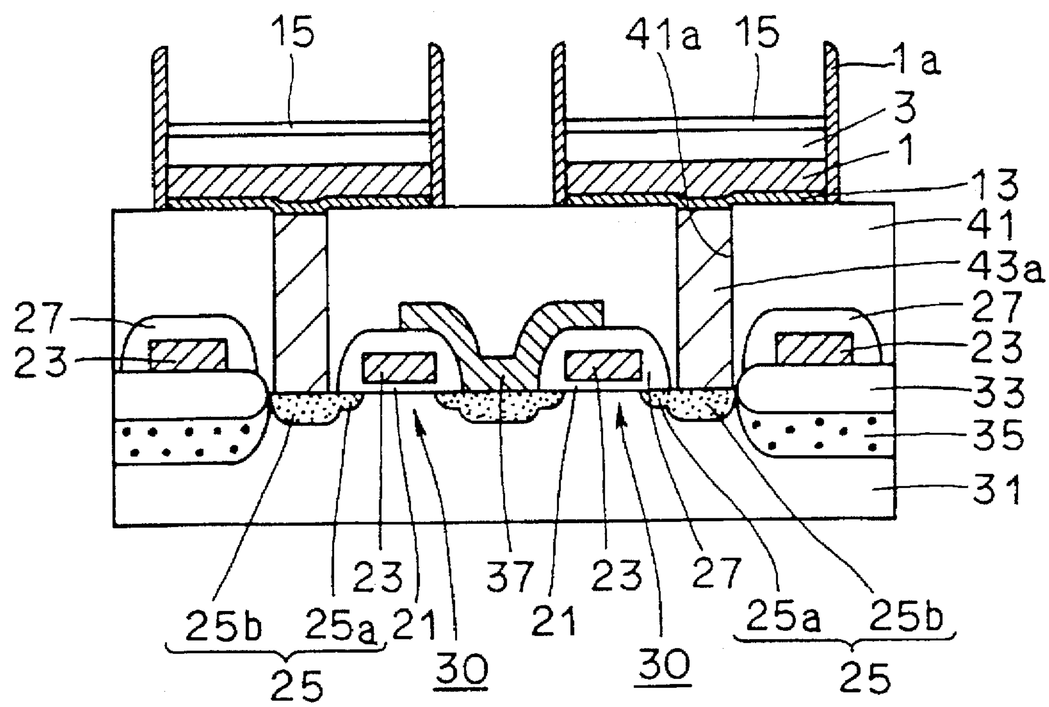

Referring to FIG. 21, by removing the resist pattern, the surface of silicon oxide film 15 is exposed, and sidewall platinum layer 1*a* higher than the top surface of silicon oxide film 15 remains. This upper portion of sidewall platinum layer 1*a* protruded beyond silicon oxide film 15 can be readily removed by physical/mechanical measures such as water jet.

Figure 22:
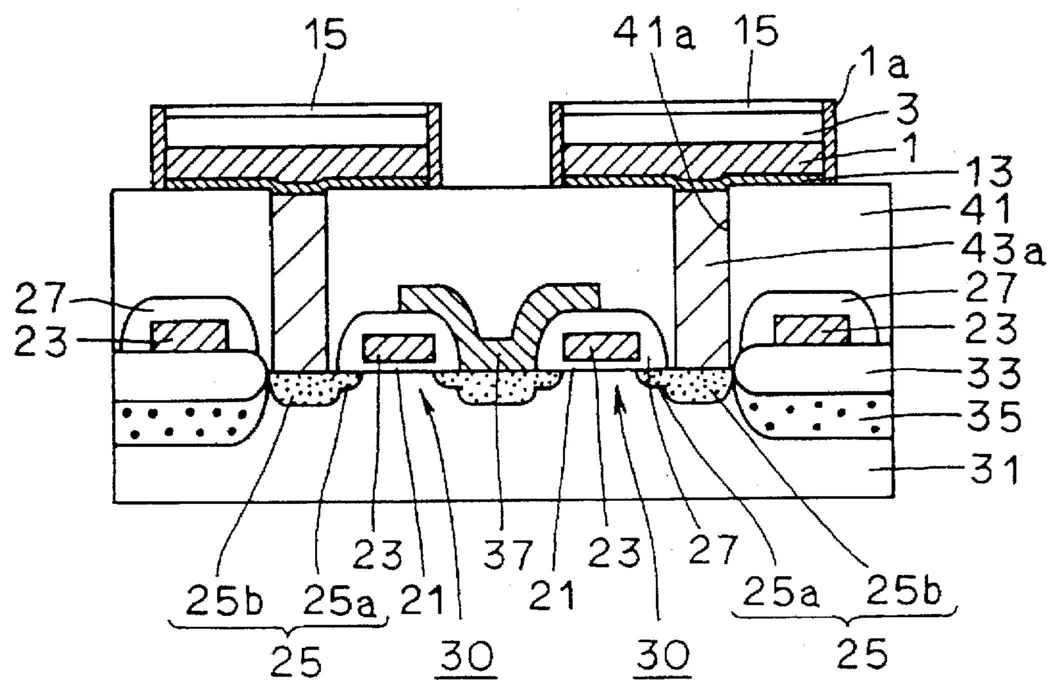

Referring to FIG. 22, the physical/mechanical measures provide the residual sidewall, i.e., platinum layer 1*a* which is connected to the sidewall of lower electrode layer 1 and has the substantially same level as the top surface of silicon oxide film 15. Thereafter, wet etching is effect on the wafer surface with aqua regia at a temperature from 50° C. to 70° C.

Figure 23:
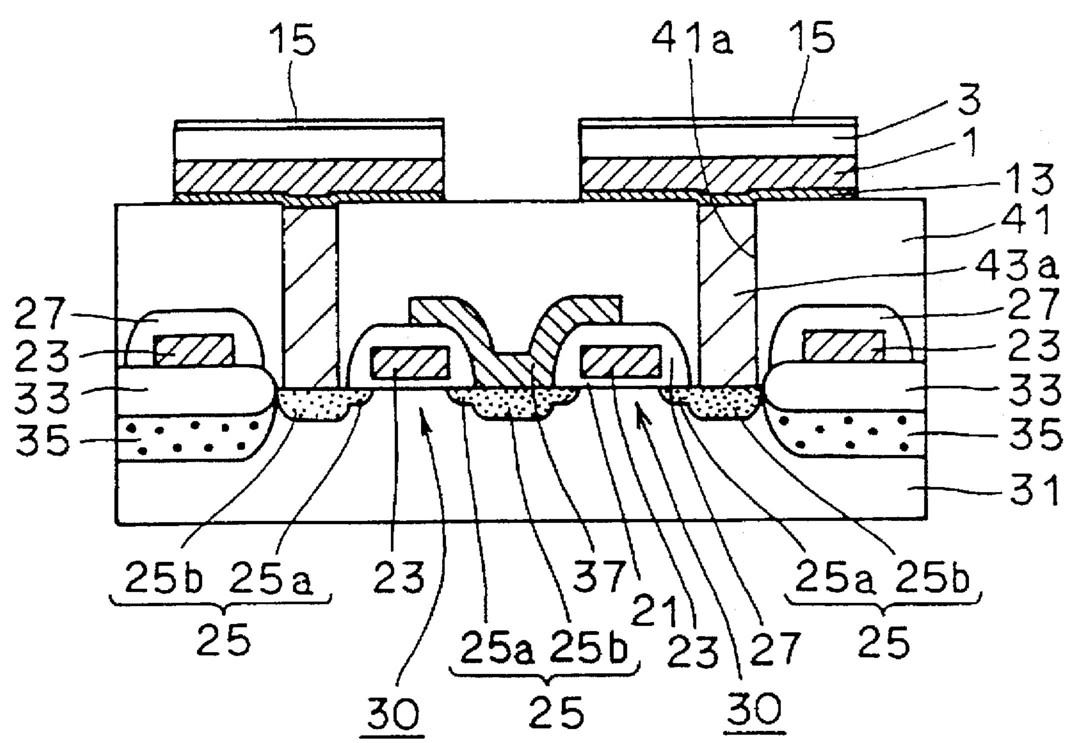

Referring to FIG. 23, this wet etching etches the platinum to a large extent, but hardly etches the silicon oxide film. Therefore, wet etching removes only the sidewall residual platinum layer. Thus, silicon oxide film 15 serves to protect capacitor insulating layer 3 and others from wet etching.

Figure 24:
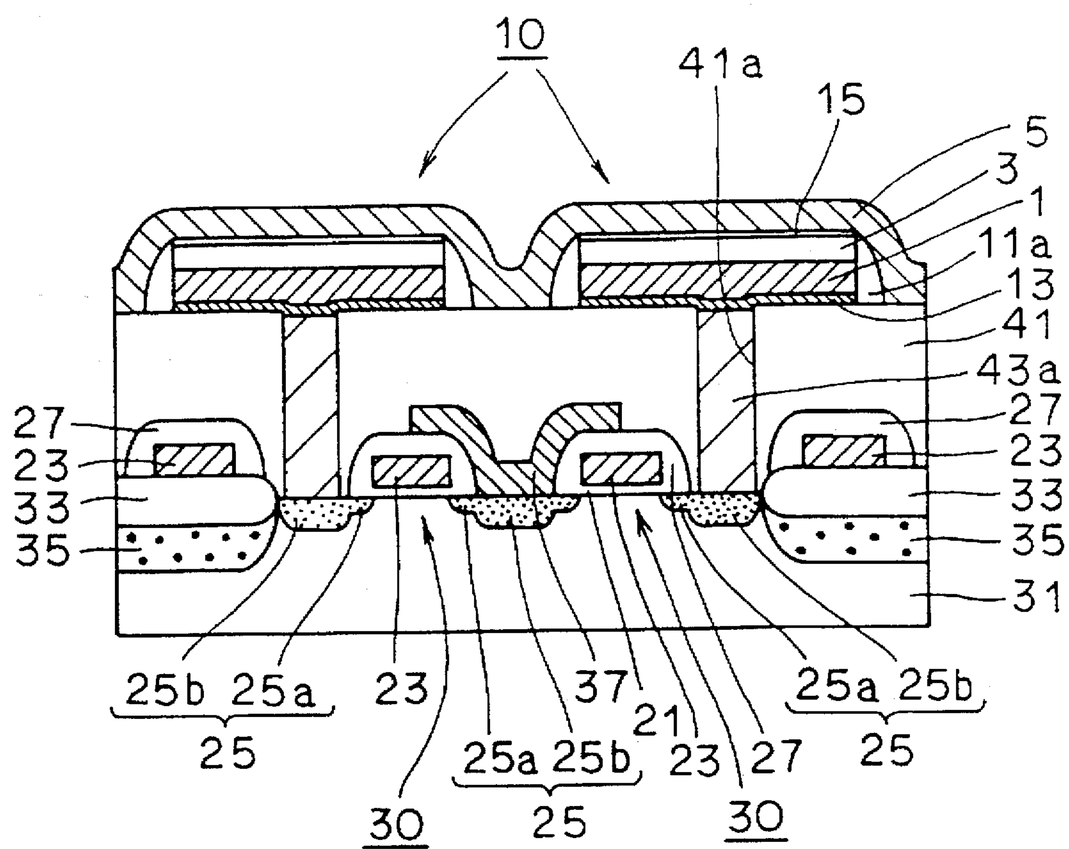

Referring to FIG. 24, sidewall insulating films 11*a* are formed by subsequent steps similarly to the embodiment already described. Further, upper electrode layer 5 made of platinum or doped polysilicon is formed to cover lower electrode layer 1 with sidewall insulating film 11*a*, capacitor insulating layer 3 and silicon oxide film 15 therebetween. In this manner, capacitor 10 is completed.

According to the first modification of the invention, silicon oxide film 15 is further disposed on capacitor insulating layer 3. Therefore, sidewall residual platinum layer 1*a* being in contact with the sidewall of lower electrode layer 1 can be removed by the wet etching without damaging capacitor insulating layer 3 by the etching. Therefore, it is possible to prevent electrical connection between lower electrode layer 1 and upper electrode layer 5 via sidewall residual platinum layer 1*a* without affecting the performance of capacitor 10.

Although the silicon oxide film is used as the protective film 15 for capacitor insulating layer 3, other material may be used provided that it is hardly etched and removed during etching of sidewall residual platinum layer 1*a*.

Modification 2

In the first and second embodiments, sidewalls of lower electrode layer 1 and capacitor insulating layer 3 provide a continuous surface. However, sidewalls of lower electrode layer 1 and capacitor insulating layer 3 may not form the continuous surface, but may form a step. Now, the case where sidewalls of lower electrode layer 1 and capacitor insulating layer 3 form a step will be described below as a second modification of the invention.

Figure 25:
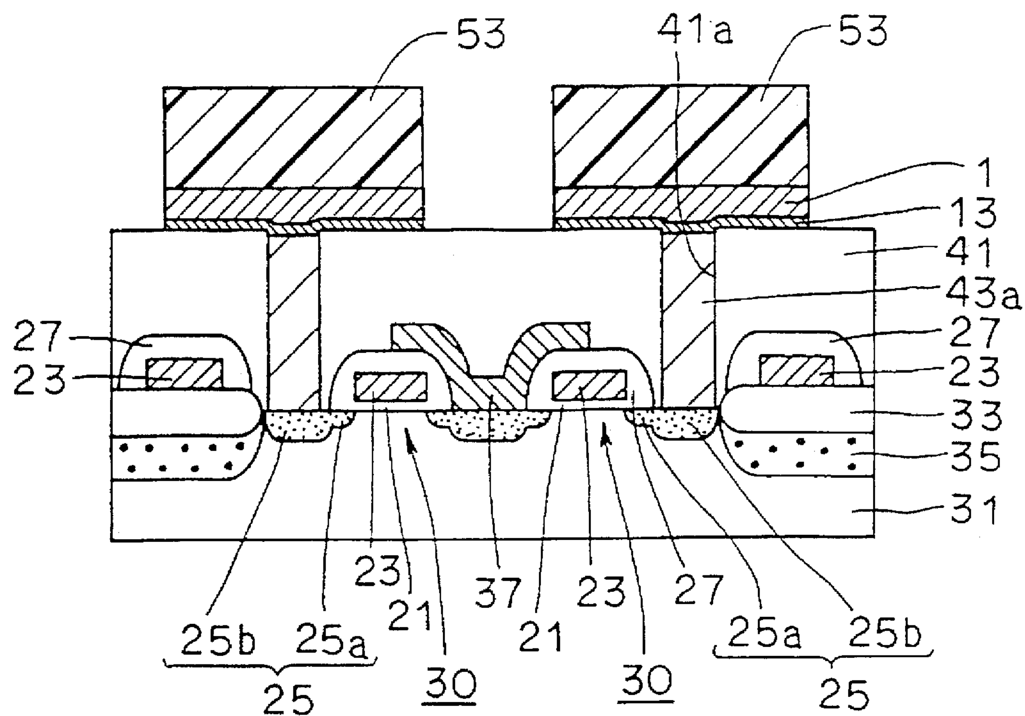
FIGS. 25 to 30 are schematic cross sections showing a process of manufacturing the semiconductor device of a second modification of the invention in accordance with the order of the steps.

According to the manufacturing method of the second modification, the steps preceding the step shown in FIG. 25 are the same as those in the conventional manufacturing method. Referring to FIG. 25, only the resist pattern is removed after lower electrode layer 1 is patterned.

Figure 26:
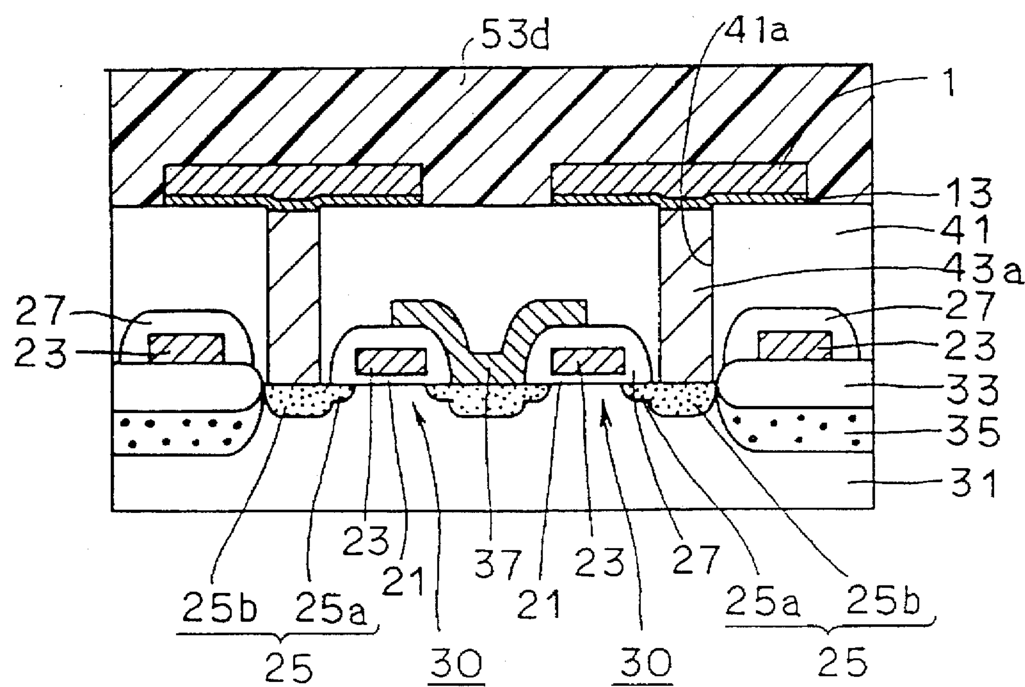

Referring to FIG. 26, photoresist 53*d* is applied to the whole surface to have a thickness of not more than 0.5 μm. Etchback is effected on the whole photoresist 53*d*.

Figure 27:
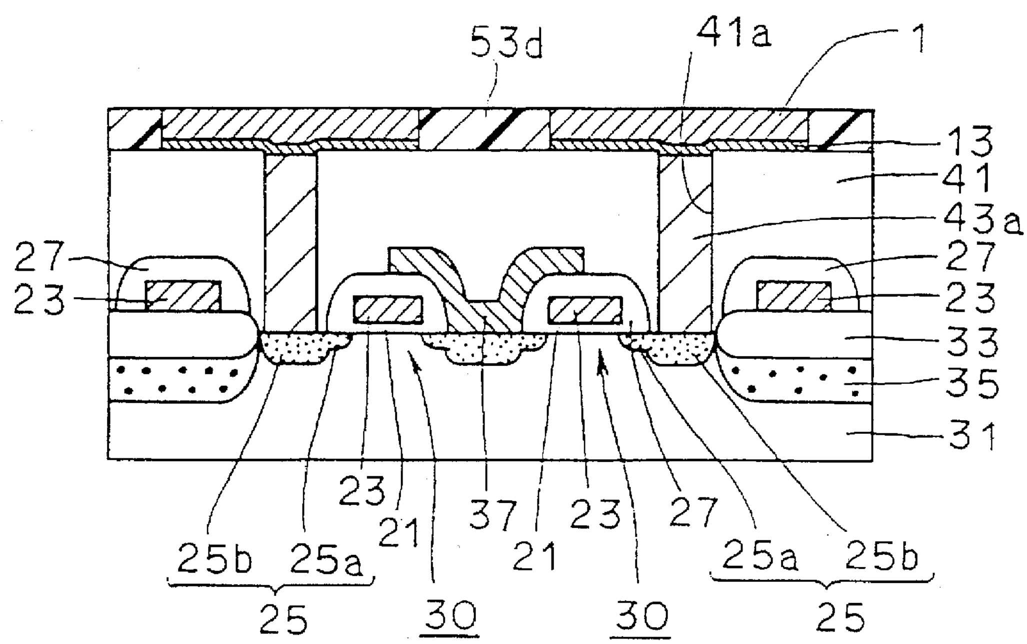

Referring to FIG. 27, this etchback leaves a resist pattern 53*d* such that the top surface of each lower electrode layer 1 is exposed. The top surface of resist pattern 53*d* is substantially continuous with the top surface of lower electrode layer 1.

Figure 28:
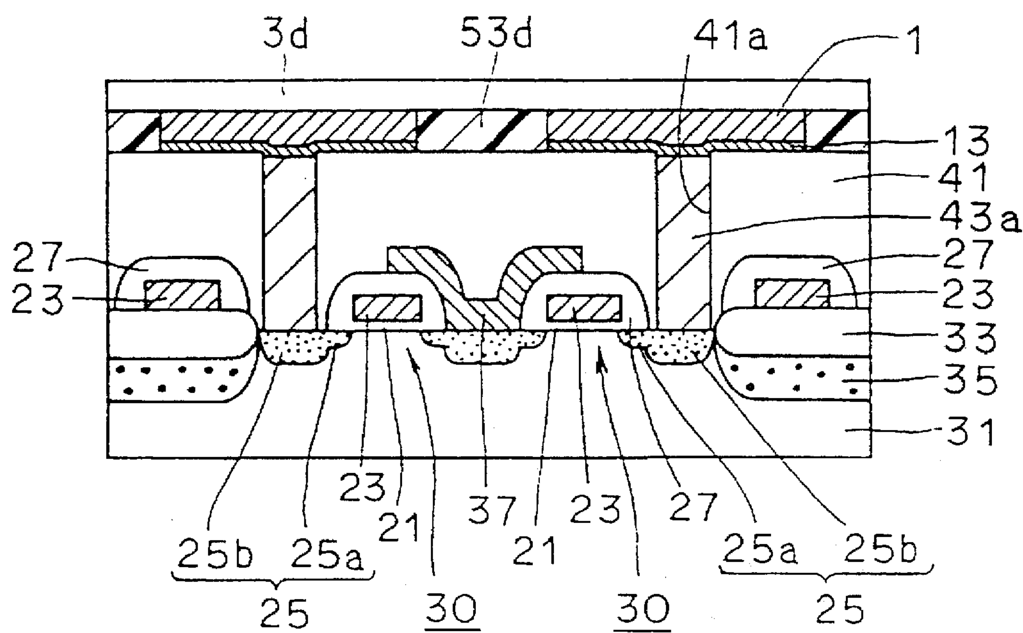

Referring to FIG. 28, a layer 3*d* made of high permittivity dielectric material such as BST, ST or PZT is formed on the whole surface. If the used high permittivity dielectric material is PZT, high permittivity dielectric material layer 3 has a thickness of from 1000 to 2000 Å. If BST is used, it has a thickness of from 500 to 1000 Å. If St is used, it has a thickness of from 300 to 700 Å.

Figure 29:
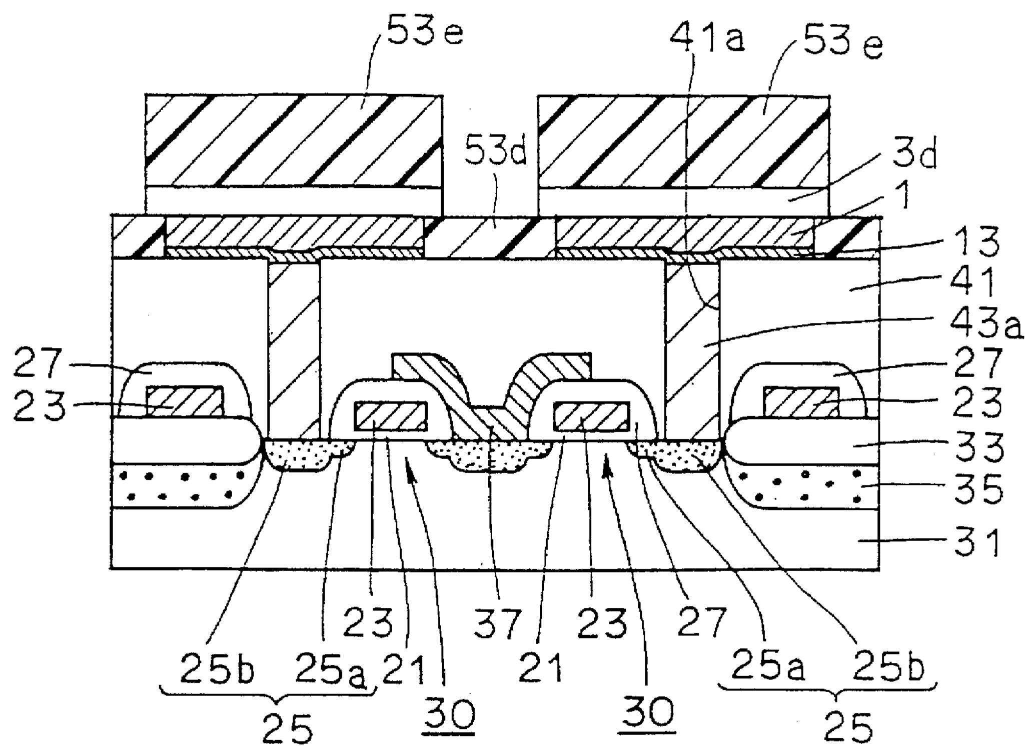

Referring to FIG. 29, a resist pattern 53*e* is formed on the surface of each high permittivity dielectric material layer 3 by exposure and development. Each resist pattern 53*e* has planar dimensions larger than those of lower electrode layer 1, and thus covers the region of lower electrode layer 1. Using resist patterns 53*e* as a mask, anisotropic etching is effected on high permittivity dielectric material layers 3*d* to form capacitor insulating layers 3*d* made of high permittivity dielectric material. Each capacitor insulating layer 3*d* has the planar dimensions larger than those of lower electrode layer 1 and thus covers the region of lower electrode layer 1. Thereafter, resist patterns 53*d* and 53*e* are removed.

Figure 30:
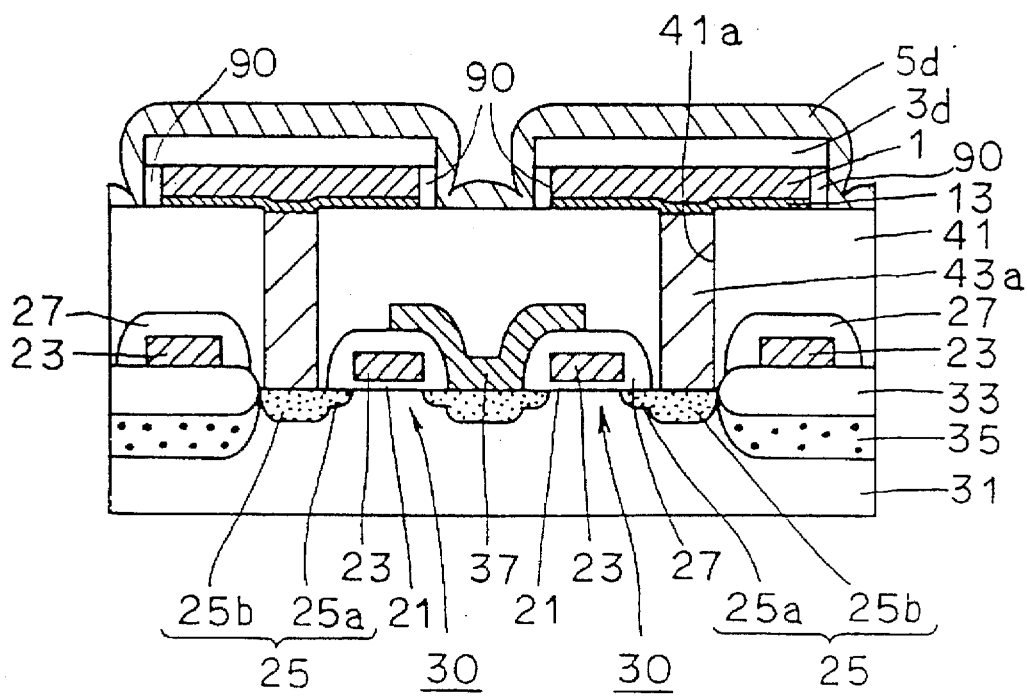

Referring to FIG. 30, a sputtering method is performed to from an upper electrode layer 5*d* which is made of platinum or the like and covers capacitor insulating layer 3*d* and interlayer insulating film 41. By this sputtering, a cavity 90 is also formed between the sidewalls of lower electrode layer 1 and upper electrode layer 5*d*. Cavity 90 prevents electrical connection between lower electrode layer 1 and upper electrode layer 5*d*.

Through the process described above, such a capacitor structure is obtained that the sidewall of lower electrode layer 1 and the sidewall of capacitor insulating layer 3*e* form a step.

In the embodiments 1 and 2 as well as the modifications 1 and 2 of the invention, ferroelectric material such as PZT as well as paraelectric material such as BS and ST are selectively used as the high permittivity dielectric material for capacitor insulating layer 3. However, as the capacitor insulating layers, paraelectric material film is more preferable than ferroelectric material film by the following reason.

Figure 31:
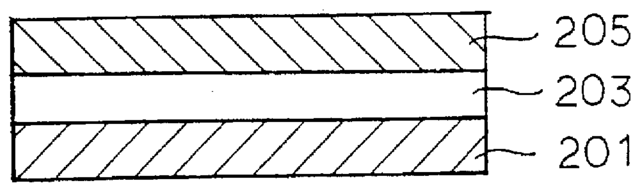
FIG. 31 is a schematic cross section showing a structure of a capacitor in which a capacitor insulating layer is made of paraelectric material or ferroelectric material.

Referring to FIG. 31, a capacitor insulating layer 203 is made of paraelectric material or ferroelectric material, and a voltage V is applied across a lower electrode layer 201 and an upper electrode layer 205 for measuring a capacitor capacitance Q. The result is shown in FIG. 32.

Figure 32:
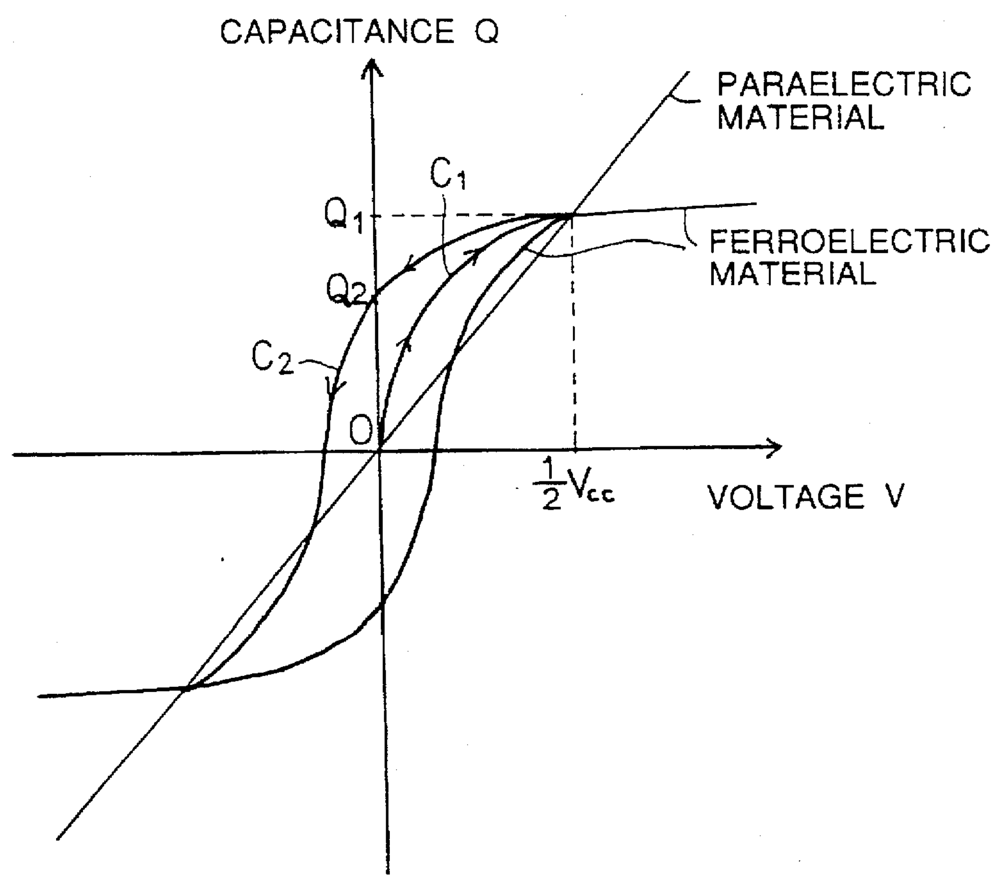
FIG. 32 is a graph showing a relationship between an applied voltage V and a capacitance Q of a capacitor where a capacitor insulating layer is made of paraelectric material or ferroelectric material.
Figure 33:
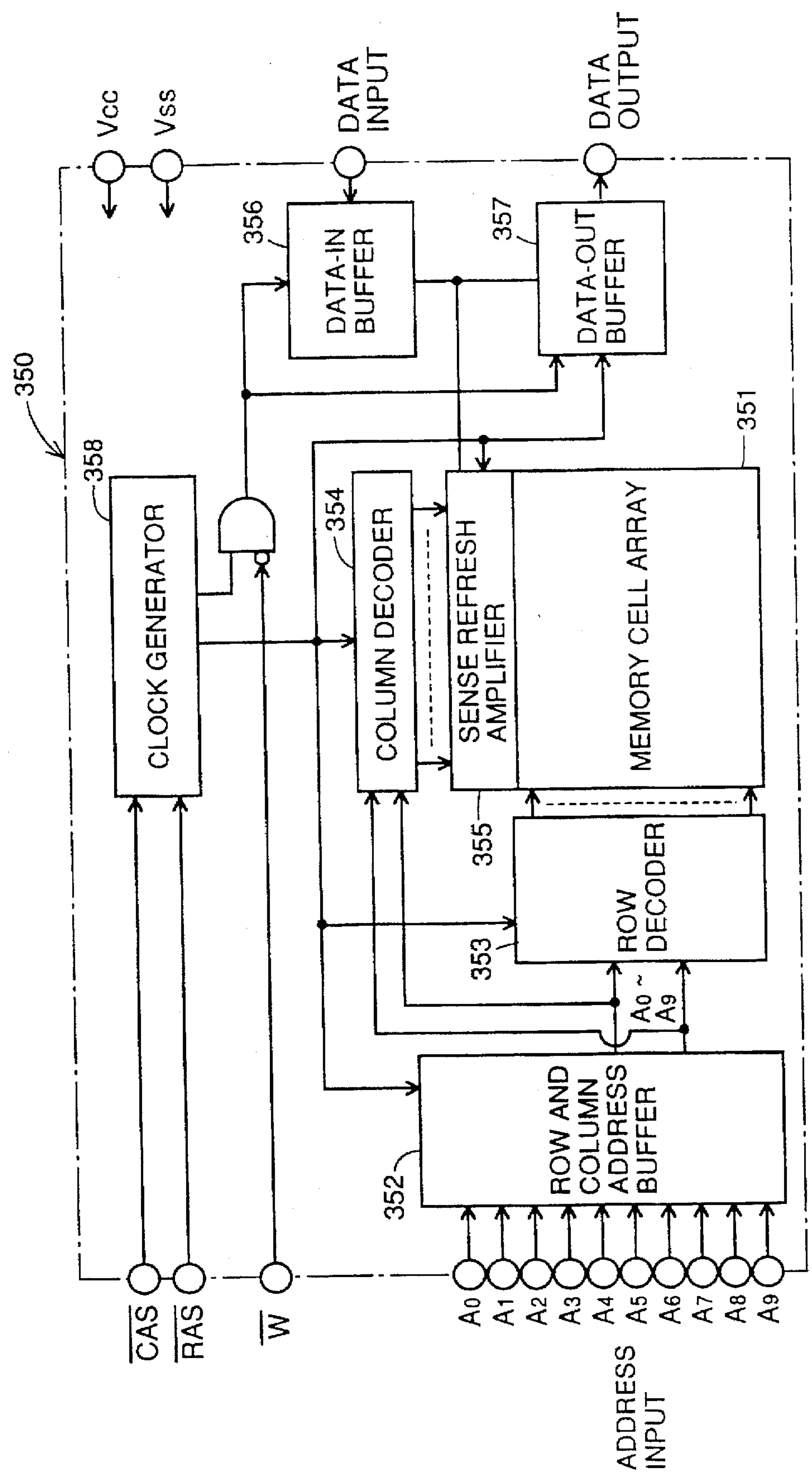
FIG. 33 is a block diagram of a conventional DRAM.
Figure 34:
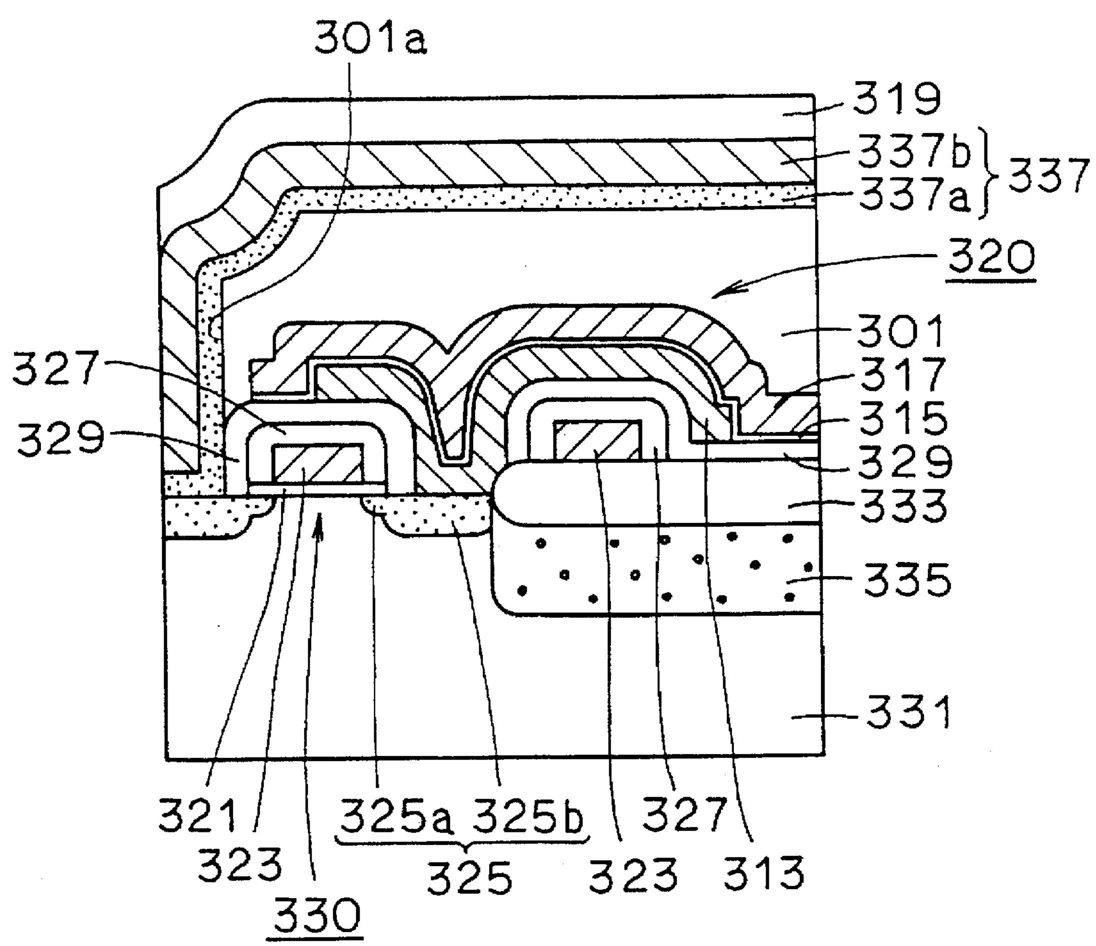
FIG. 34 is a schematic cross section showing a memory cell structure of a DRAM having a conventional stacked type capacitor.
Figure 35:
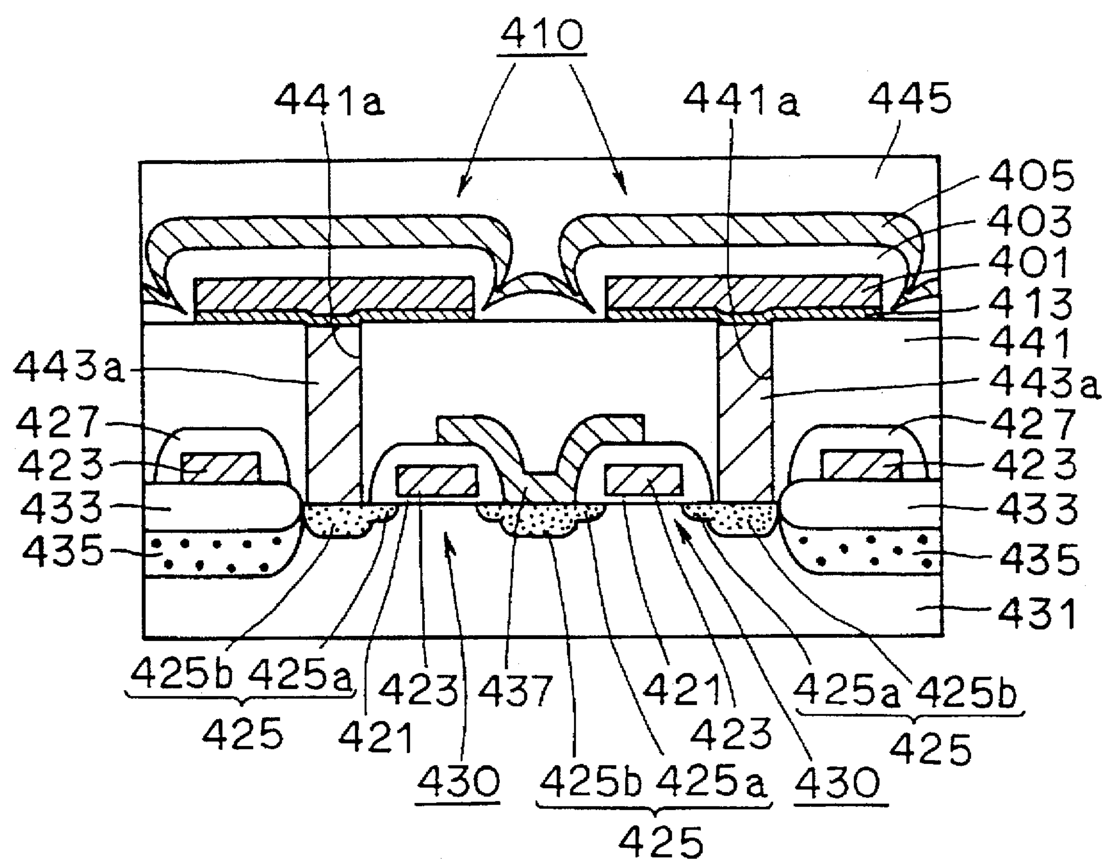
FIG. 35 is a schematic cross section showing a structure of a conventional semiconductor device.
Figure 36:
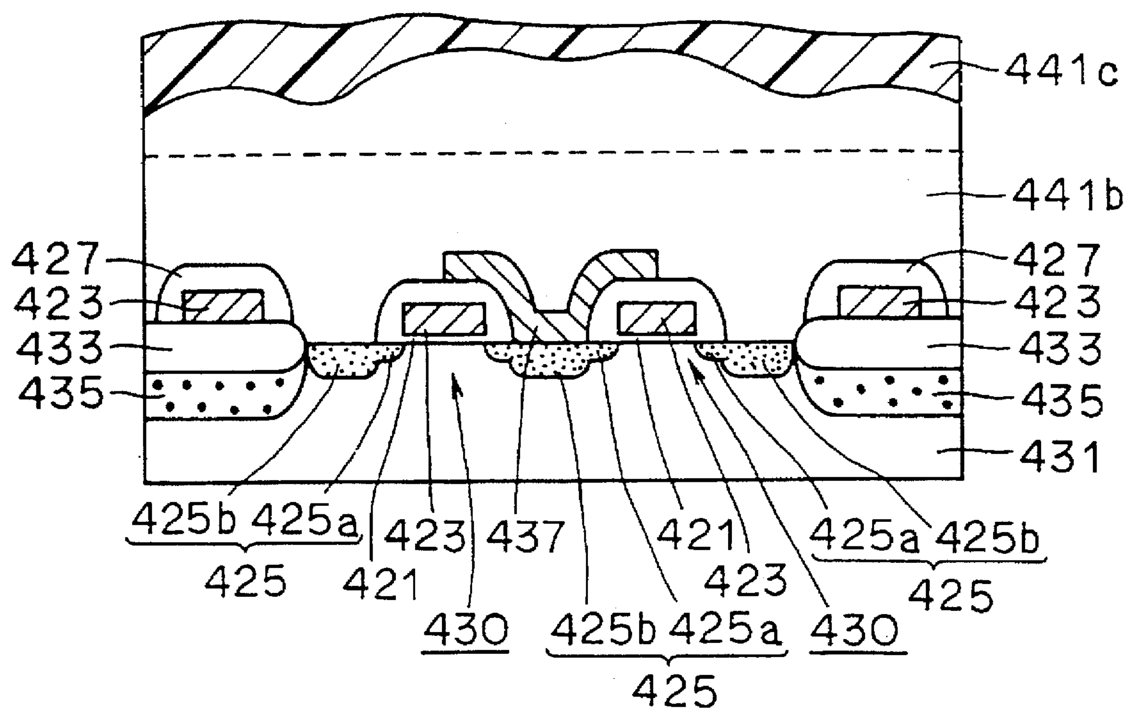
FIGS. 36 to 45 are schematic cross sections showing a process of manufacturing the conventional semiconductor device in accordance with the order of the steps.
Figure 37:
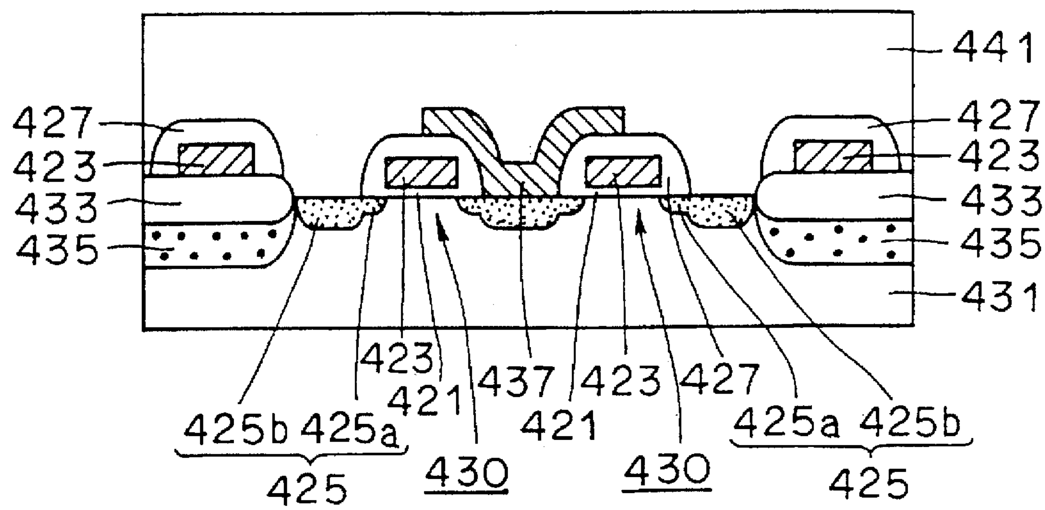
Figure 38:
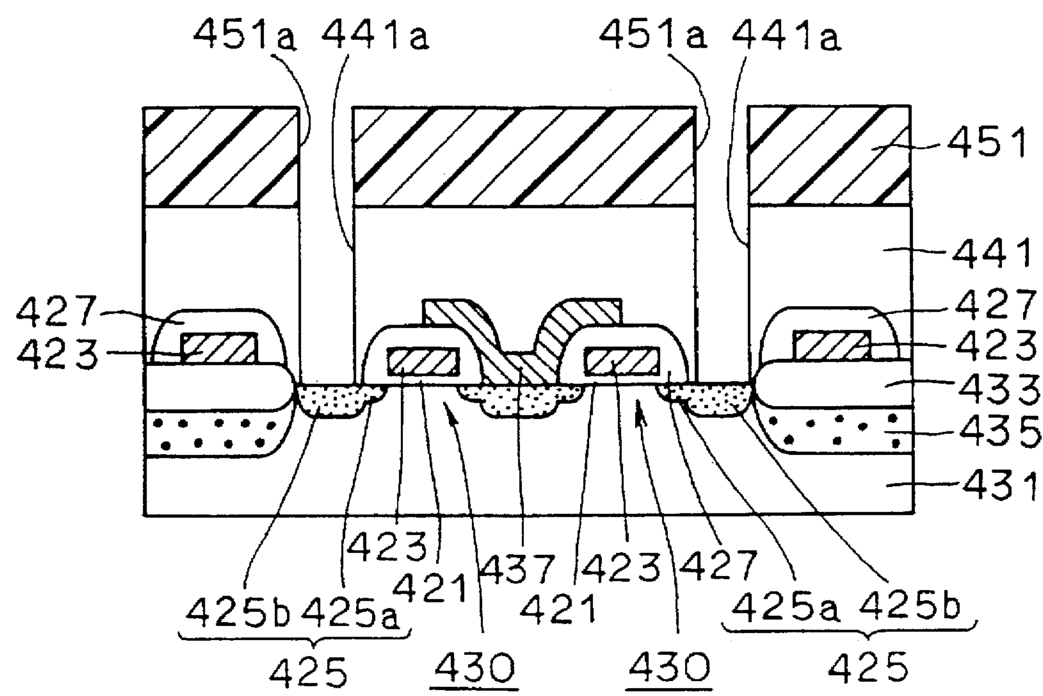
Figure 39:
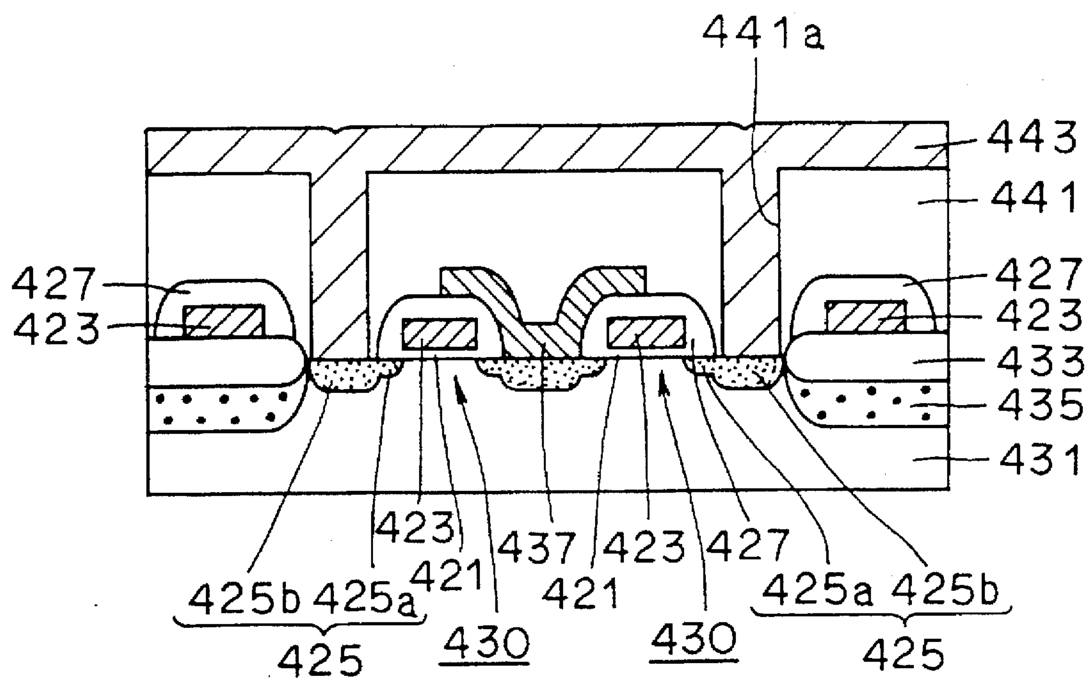
Figure 40:
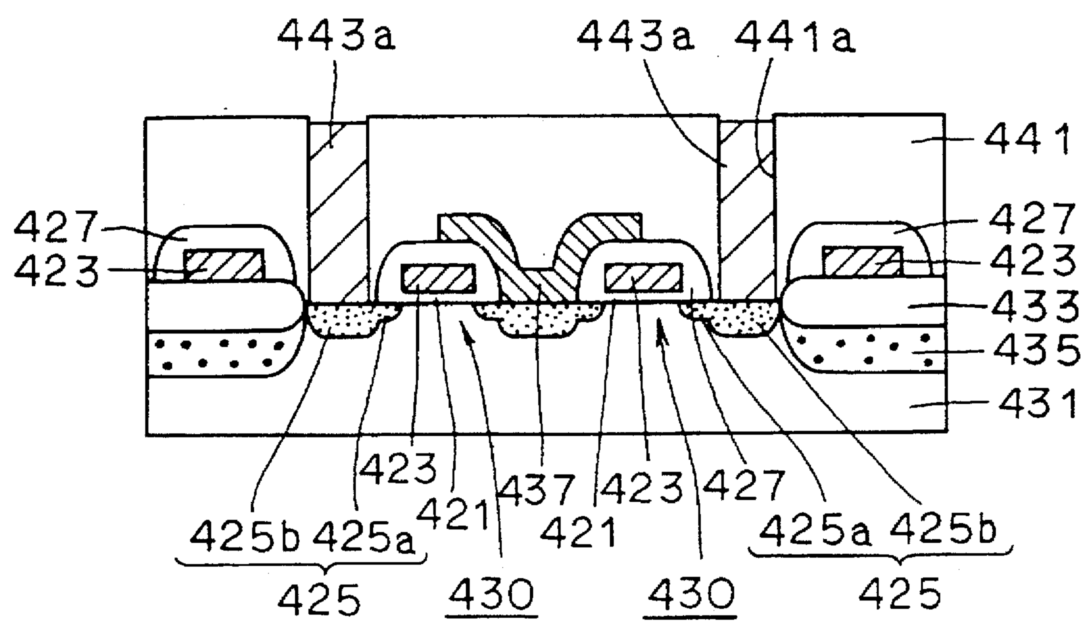
Figure 41:
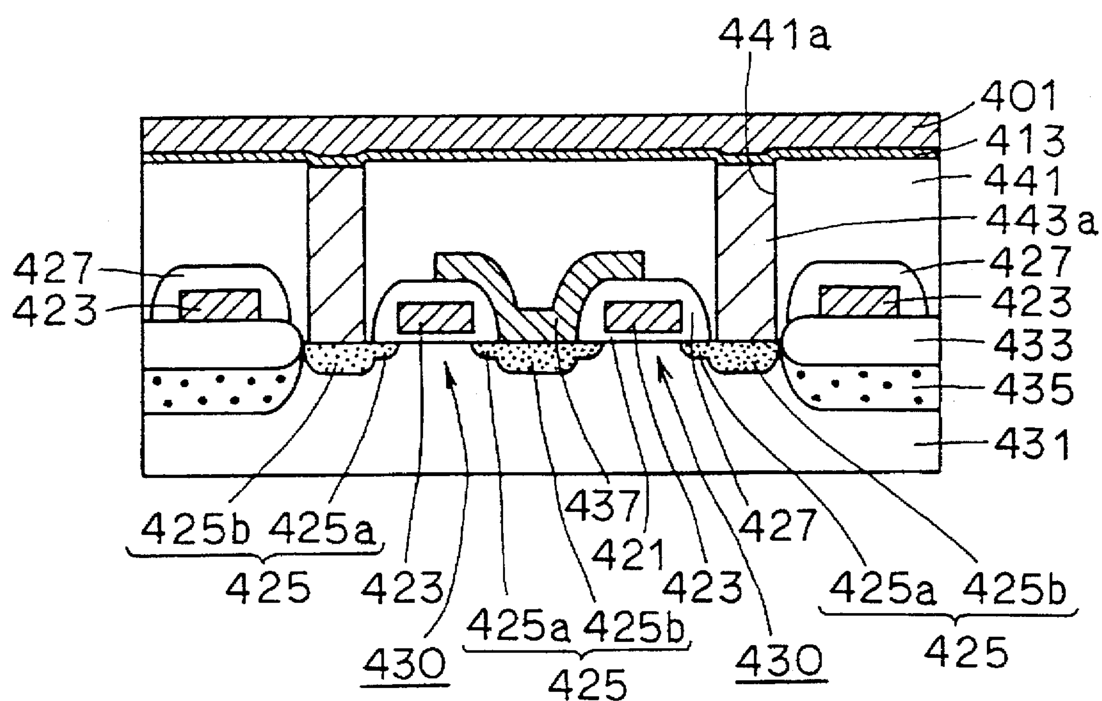
Figure 42:
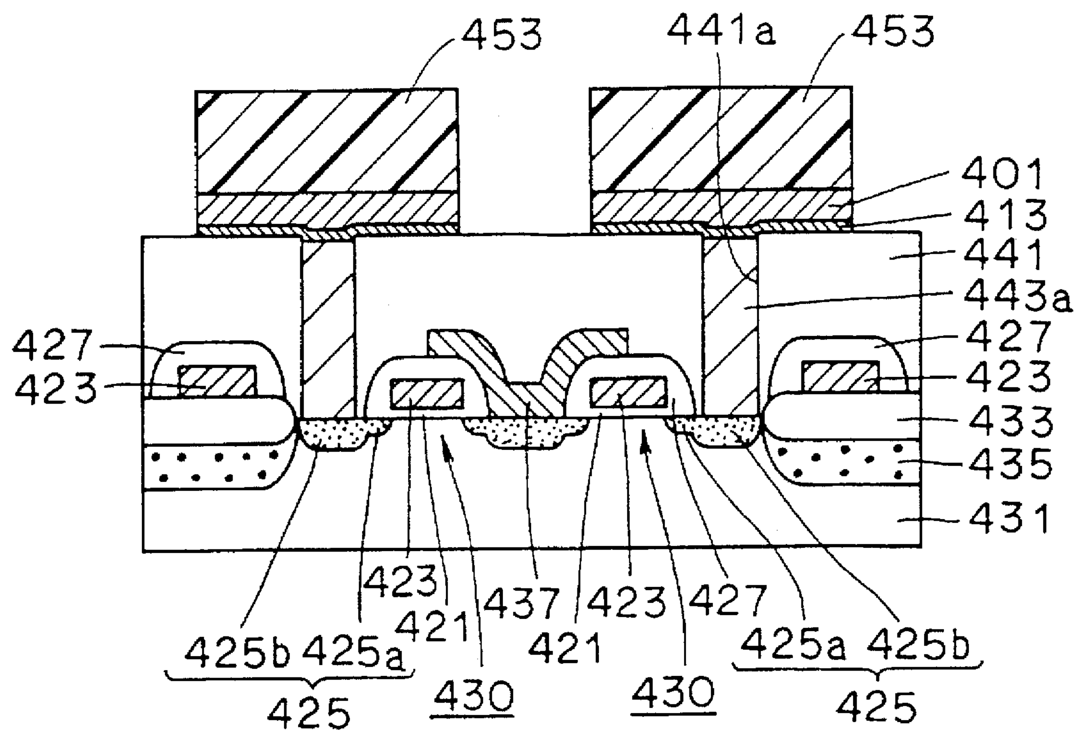
Figure 43:
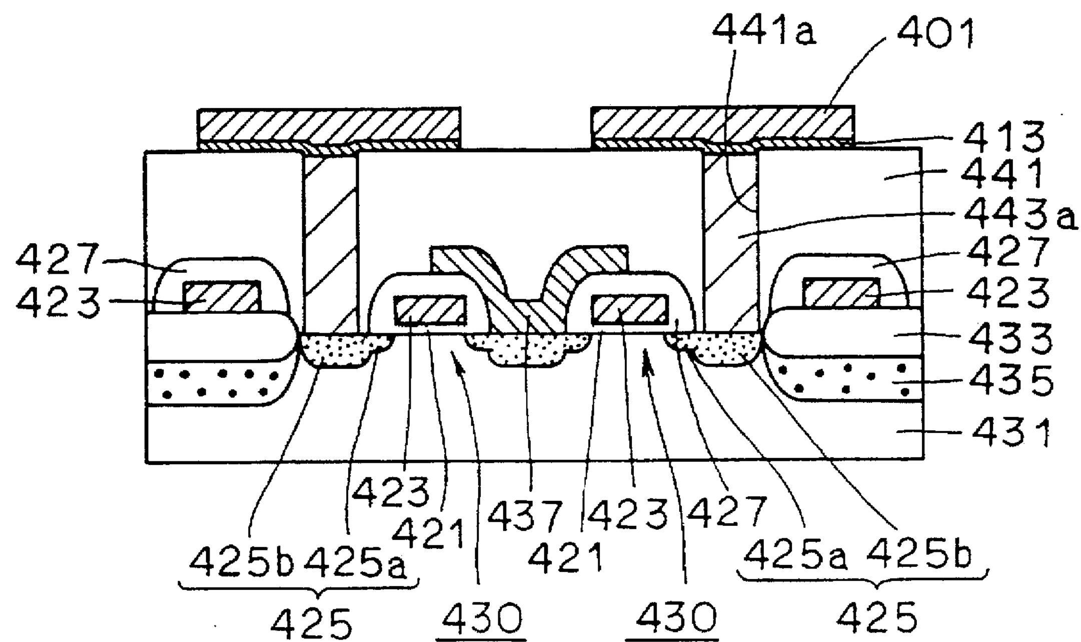
Figure 44:
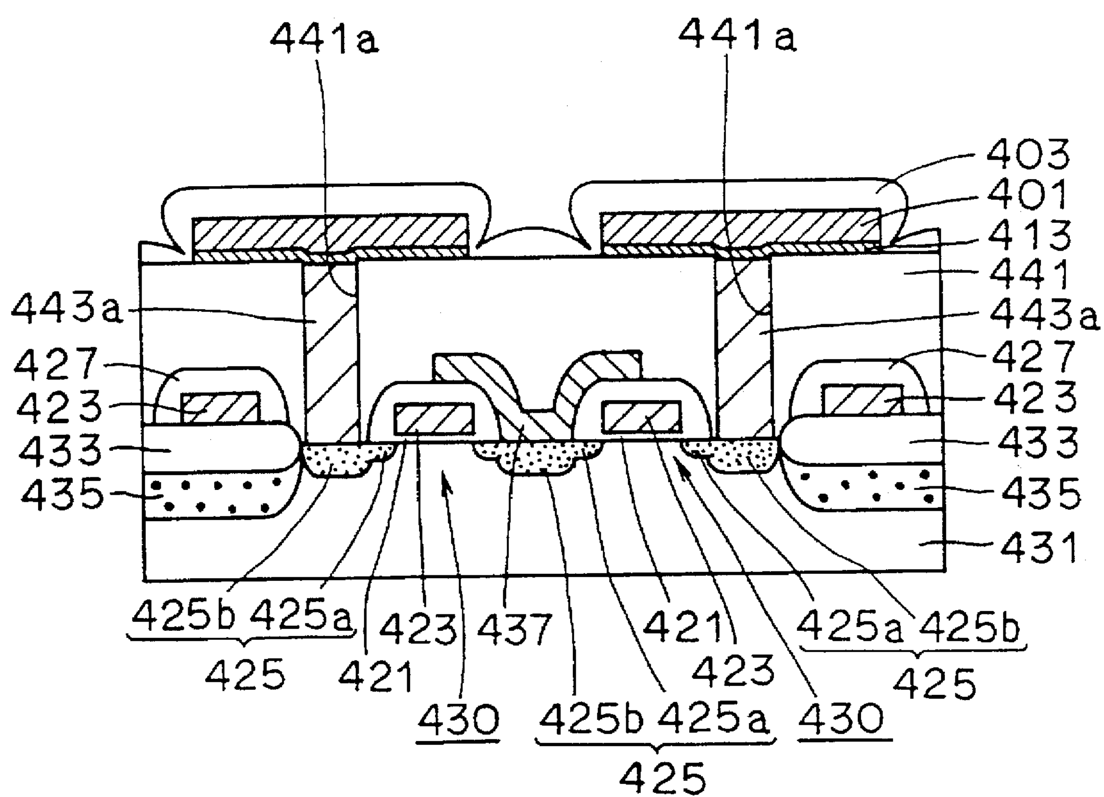
Figure 45:
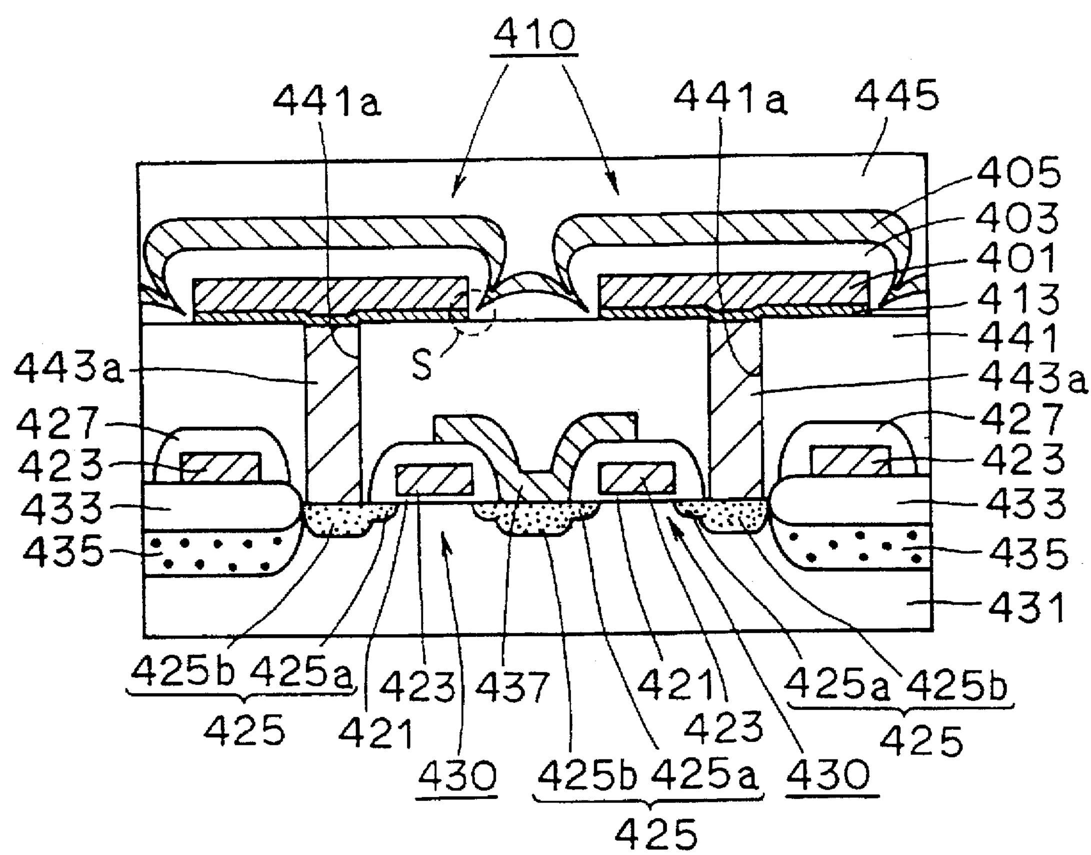
Figure 46:
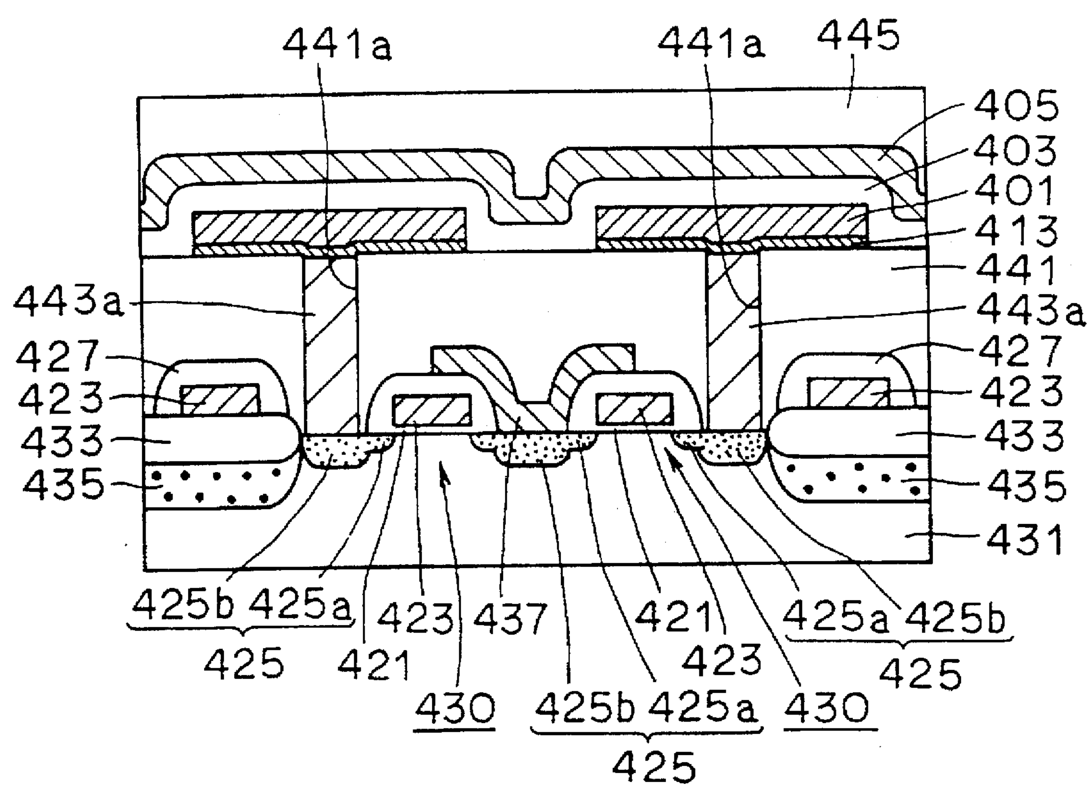
FIG. 46 is a schematic cross section showing a structure where a capacitor insulating layer is formed by a CVD method in the conventional method of manufacturing the semiconductor device.
Figure 47:
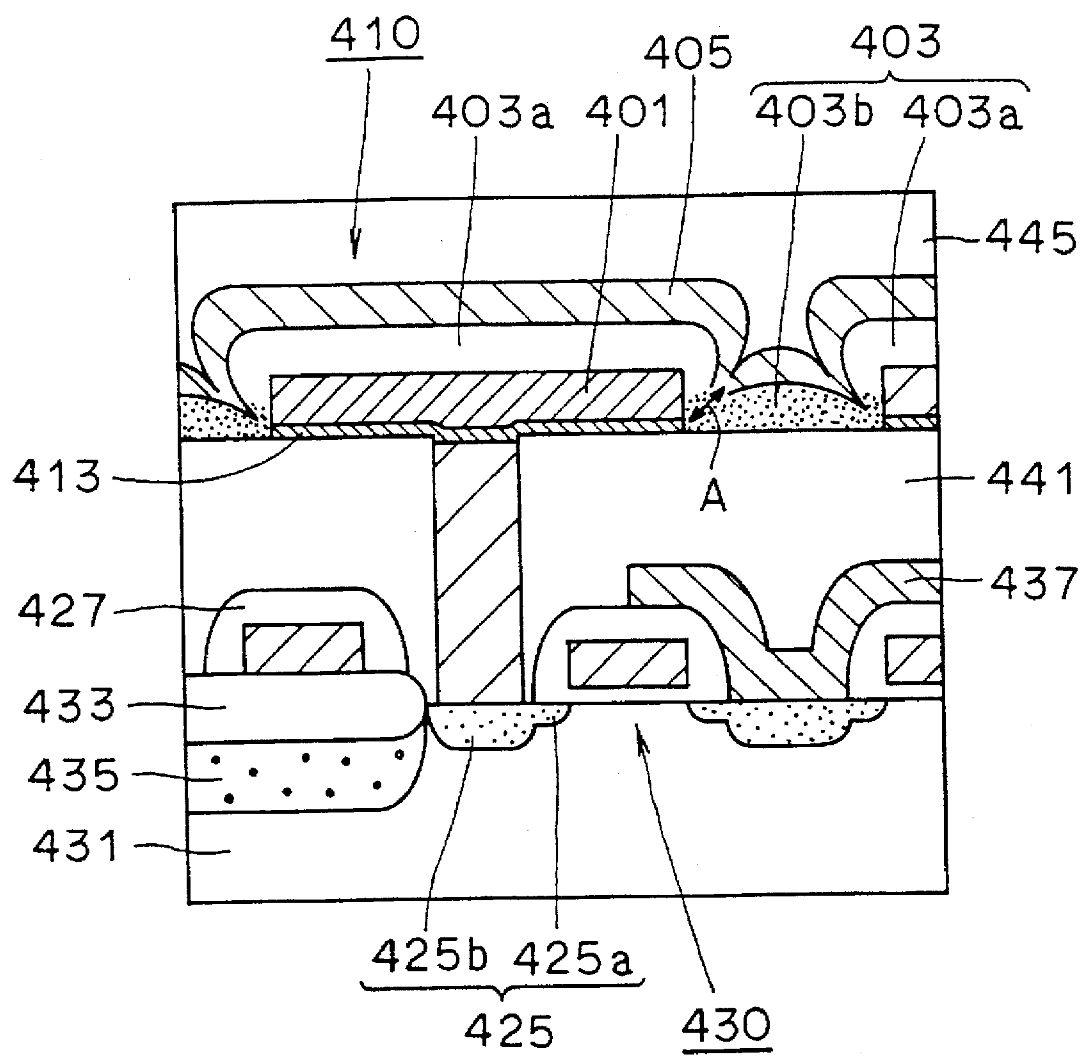
FIG. 47 is an enlarged schematic cross section showing a capacitor part shown in FIG. 35.
Figure 48:
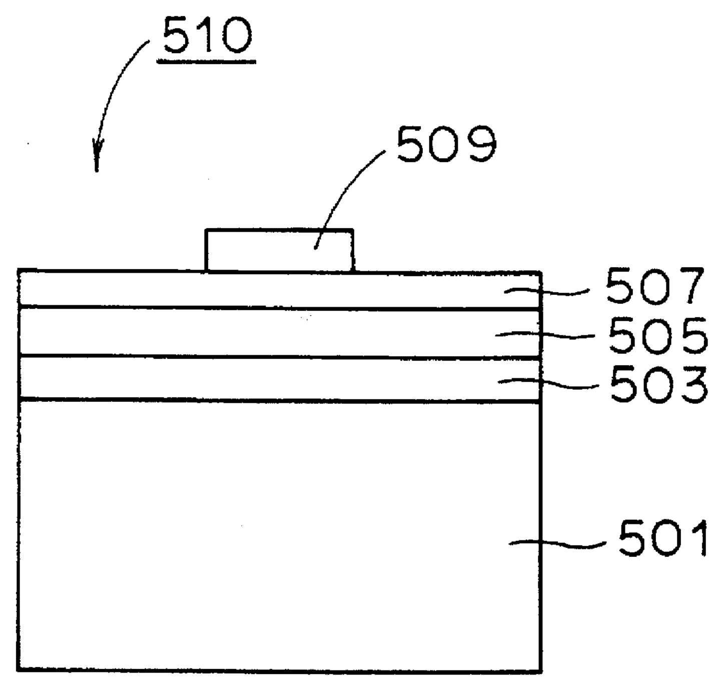
FIG. 48 is a schematic cross section showing a structure of a sample used in an experiment.
Figure 49:
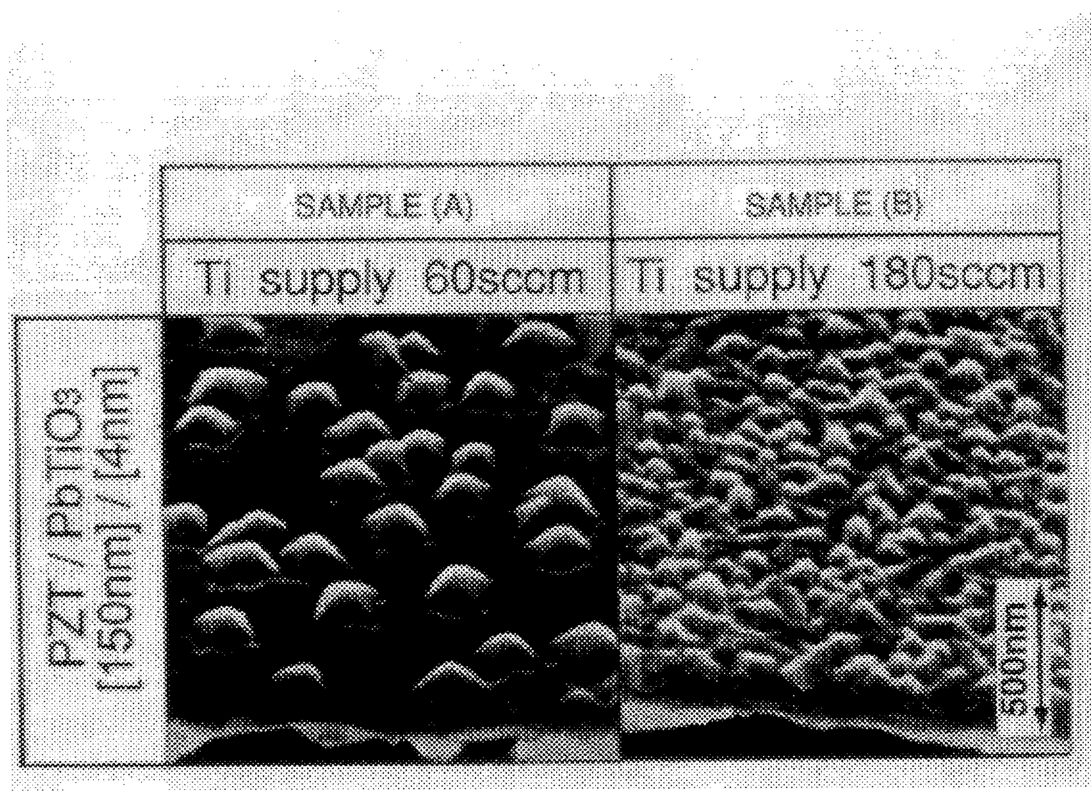
FIG. 49 shows surface conditions of samples of ferroelectric material shown in FIG. 48 which were observed by a scanning electron microscope.
Figure 50A:
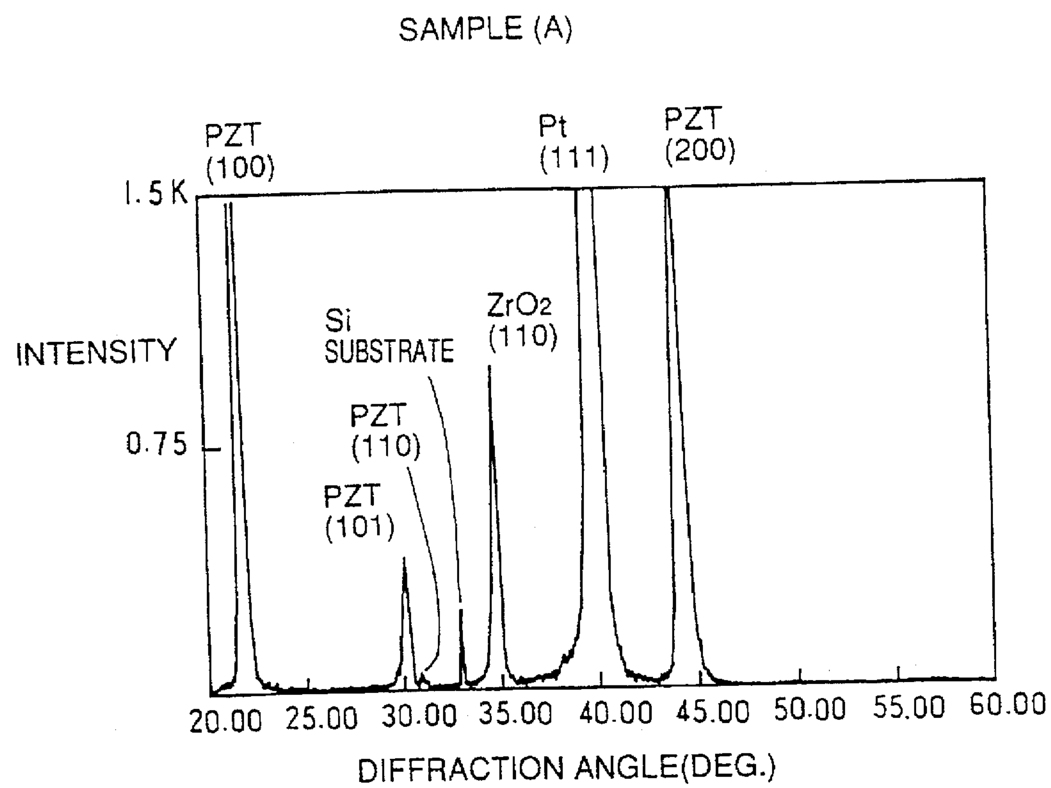
FIG. 50A shows a result of the experiment obtained by X-ray diffraction of a sample (A)
Figure 50B:
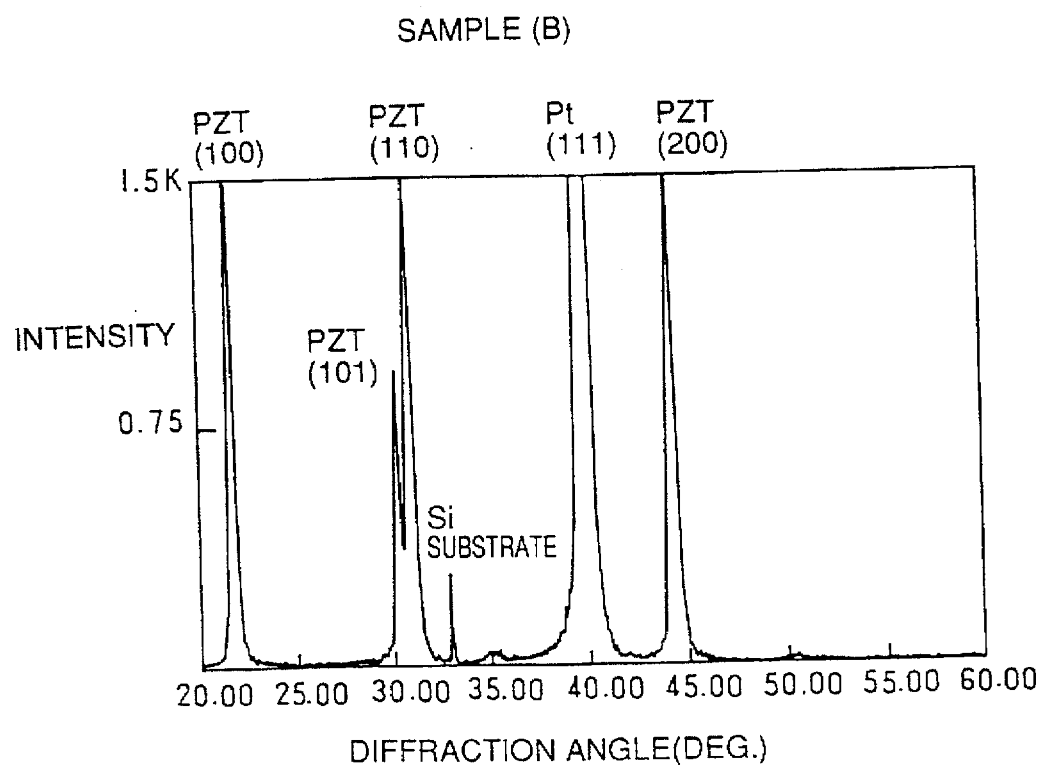
FIG. 50B shows a result of the experiment obtained by X-ray diffraction of a sample (B)
Figure 51:
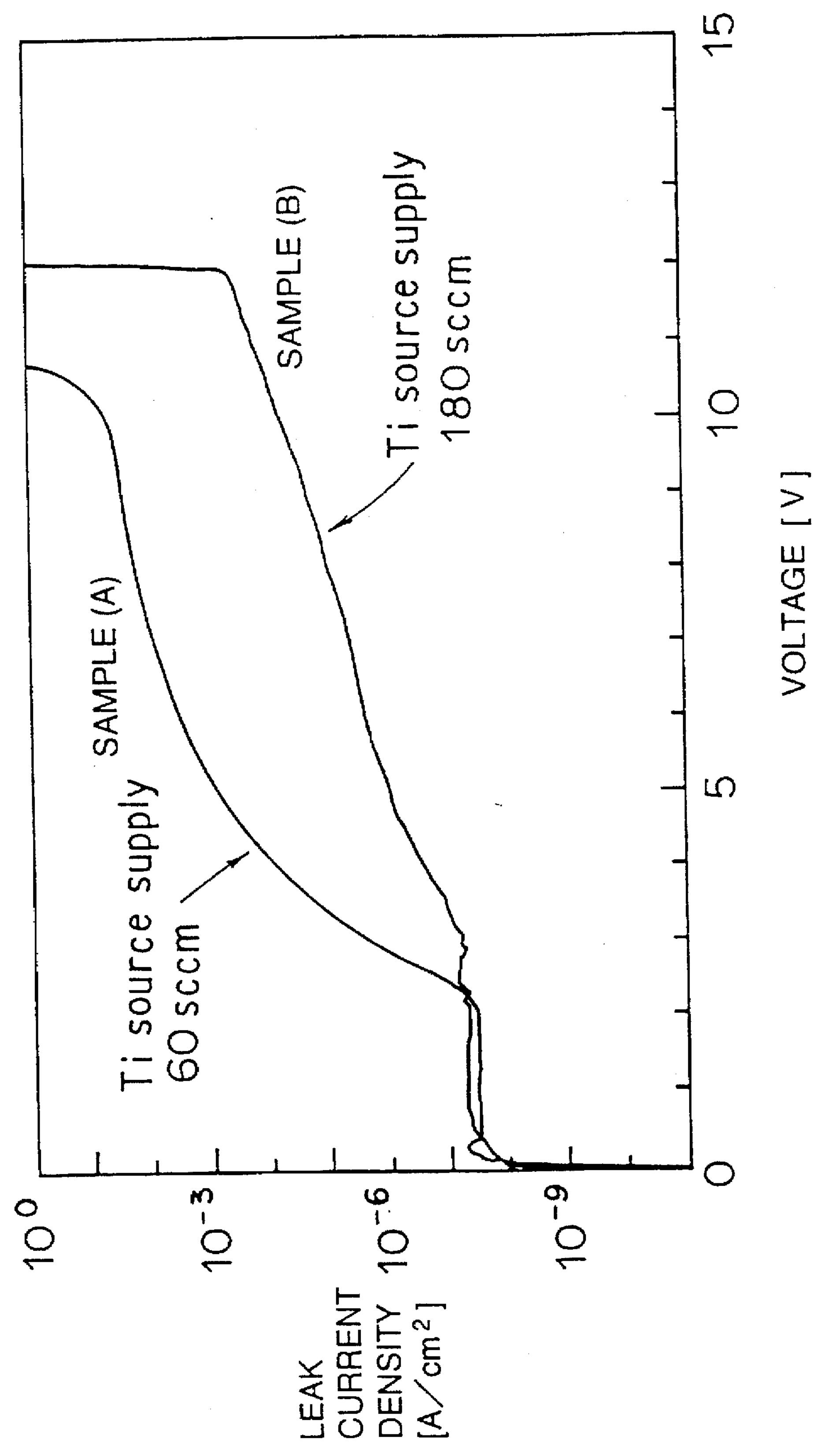
FIG. 51 shows a result of the experiment measuring leak currents generated in the samples (A) and (B)
Figure 52:
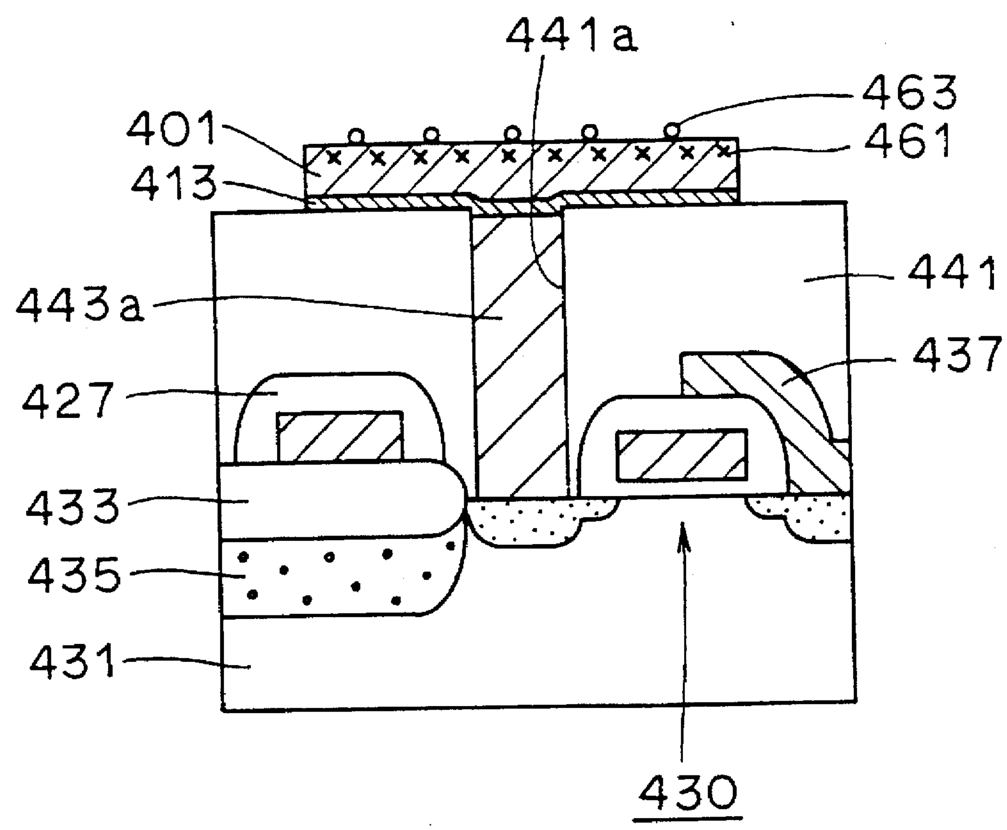
FIG. 52 is a schematic cross section showing a state where damage and absorption are caused at a surface of a lower electrode layer in the conventional semiconductor device.

Referring to FIG. 32, relationship between applied voltage V and capacitance Q is represented by a nearly straight line, if the capacitor insulating layer is a paraelectric film. Thus, applied voltage V and capacitance Q are nearly proportional to each other.

Meanwhile, relationship between applied voltage V and capacitance Q is represented by hysteresis lines, if the capacitor insulating layer is a ferroelectric film. More specifically, at the beginning of application of voltage V across the capacitor electrodes, capacitance Q increases from capacitance Q=0 at voltage V=0 along curve $C_1$. If the applied voltage V across the capacitor electrodes is reduced, capacitance Q decreases along curve $C_2$, and capacitance $Q_2$ larger than 0 remains between capacitor electrodes even at the voltage V of 0.

Owing to the relationship between applied voltage V and capacitance Q described above, the following advantages can be achieved if the paraelectric film is used as the capacitor insulating layer as compared with the case where ferroelectric film is used.

(1) Amount of effective charges of the capacitor can be increased.

(2) Film fatigue can be prevented. These advantages will be described below in detail.

(1) Effective charges

If the paraelectric film is used as the capacitor insulating layer, the relationship between applied voltage V and capacitance Q of the capacitor is represented by a nearly straight line. Therefore, a capacitance Q1 is obtained if a voltage $V_{CC}/2$ is applied across the capacitor electrodes, and the capacitance will go to 0 if the applied voltage across the capacitor electrodes is set to 0 thereafter. Therefore, the amount of effective charges of the capacitor (amount of charges actually used during the operation of the capacitor) is equal to $Q_1-0=Q_1$.

Meanwhile, the relationship between applied voltage V and capacitance Q is represented by hysteresis curve, if a ferroelectric film is used as the capacitor insulating layer. Therefore, the capacitance $Q_1$ is obtained if voltage $V_{CC}/2$ is applied across the capacitor electrodes, and capacitance $Q_2$ will remain if the applied voltage is set to 0 thereafter. As a result, the amount of effective charges of the capacitor is equal to $Q_1-Q_2$, and thus is lower than the amount of effective charges $Q_1$, which is obtained if the paraelectric film is used as the capacitor insulating layer. If the amount of effective charges of the capacitor is small, reading of data becomes difficult, which may cause malfunction of the integrated circuit.

By the aforementioned reasons, use of the paraelectric film as the capacitor insulating layer can ensure a large effective charge quantity of the capacitor and can achieve a stable operation, as compared with the case of use of the ferroelectric film.

(2) Film fatigue

If the relationship between applied voltage V and capacitance Q of the capacitor is represented by the hysteresis curve, film fatigue occurs in the capacitor insulating layer. Generation of the film fatigue is described, for example, in H. M. Duiker et al. "Fatigue and Seitching in Ferroelectric Memories Theory and Experiment" J. Appln. Phys. 68(11), 1 Dec. 1990, pp. 5783–5791, and R, Moazzami et al. "ENDURANCE PROPERTIES OF FERROELECTRIC PZT THIN FILMS" IEDM 90, pp. 417–420.

Therefore, use of the ferroelectric film as the capacitor insulating layer results in the film fatigue of the capacitor insulating layer. If the film fatigue is generated in the capacitor insulating layer, a leak current is likely between the capacitor electrodes.

Meanwhile, if the paraelectric film is used as the capacitor insulating layer, the relationship between applied voltage V and capacitance Q is represented by a nearly straight line, so that the film fatigue is unlikely to generate in the capacitor insulating layer.

Therefore, if the paraelectric film is used as the capacitor insulating layer, the film fatigue of the capacitor insulating layer is suppressed, and thus the leak current between the capacitor electrodes is suppressed.

The embodiments and modifications of the invention have been described in connection with the barrier layer having three-layer structure including the titanium layer, titanium nitride layer and titanium layer. However, barrier layer 13 may have other structure such as a titanium single layer or a two-layer structure including a titanium layer and a titanium nitride layer. If the titanium single layer is employed, barrier layer 13 has a film thickness of, e.g., 200 Å. Barrier layer 13 may be made of titanium, high melting point metal, silicide of them, oxide of them, or alloy of them, and in other words, various kinds of material may be used provided that it can prevent diffusion of impurity from plug layer 43a into lower electrode layer 1 and can improve adhesion between interlayer insulating film 41 and lower electrode layer 1.

Although platinum has been described as the material of lower electrode layer 1, other material such as palladium or $RuO_2$ may be used.

PZT, PLZT, BST and ST have been described as the material of capacitor insulating layer 3, other material may be employed provided that it is so-called high permittivity dielectric material.

Upper electrode layer 5, which is made of platinum or doped polysilicon according to the foregoing description, may be made of other material such as aluminum, aluminum alloy (e.g., AlSi or AlSiCu), titanium (Ti), titanium nitride (TIN) or tungsten (W). Instead of the single layer structure, upper electrode layer 5 may have multi-layer structure including a titanium nitride layer and a platinum layer.

In the first and second embodiments of the invention, capacitor insulating layer 3 is formed by the sputtering method or CVD method, and in either case capacitor 10 can have good anti-leak characteristics and good breakdown voltage characteristics. In general, the CVD method attains the film forming speed of from 150 to 200 Å/min., and the sputter method attains the film forming speed of from 25 to 30 Å/min. Therefore, from the view point of the film forming speed, it is desirable to form capacitor insulating layer 3 in the embodiment of the invention by the CVD method.

According to the semiconductor device of the invention, the capacitor insulating layer is formed only on the lower electrode layer. Therefore, the capacitor insulating layer has neither a locally thin portion nor a discontinuous portion. Accordingly, it is possible to obtain the capacitor having good anti-leak characteristics and good breakdown voltage characteristics while maintaining the function of the capacitor.

The capacitor insulating layer is formed only on the lower electrode layer. Therefore, even if the capacitor insulating layer is formed by the sputtering method, the capacitor insulating layer has a relatively large number of perovskite structures as compared with a portion formed on the top surface of the insulating layer. Accordingly, the capacitor having good anti-leak characteristics and good breakdown voltage characteristics can be obtained.

In the semiconductor device according to a preferred embodiment of the invention, the sidewall insulating layer covering the sidewall of the lower electrode layer is formed on the top surface of the insulating layer. The sidewall insulating layer has the portion extending upward from the top surface of the insulating layer, and this upward portion is formed such that its width decreases as the position moves from the lower portion to the higher portion. Therefore, the upper electrode layer formed on the sidewall insulating layer can have improved step coverage.

In the semiconductor device according to another preferred aspect of the invention, the large amount of effective charges of the capacitor can be ensured, so that malfunction is suppressed when reading data stored in the capacitor. The film fatigue of the capacitor insulating layer is also suppressed, so that generation of the leak current between the capacitor electrodes can be prevented.

In the semiconductor device of still another preferred aspect of the invention, increase of the leak current between the capacitor electrodes can be prevented.

In the semiconductor device of yet another preferred aspect of the invention, a desirable capacitor capacitance can be maintained.

According to the method of manufacturing the semiconductor device of the invention, the capacitor insulating layer is formed on the lower electrode layer before patterning the lower electrode layer. Therefore, even if the capacitor insulating layer is formed by the CVD method which is a growth method sensitive to the base surface, the capacitor insulating layer can have a relatively large number of perovskite structures on the lower electrode layer. Accordingly, the capacitor having good anti-leak characteristics and good breakdown voltage characteristics can be formed.

The capacitor insulating layer is formed on the lower electrode layer before patterning the lower electrode layer. Owing to this, the capacitor insulating layer has neither a thin portion nor a discontinuous portion. Accordingly, the capacitor having good anti-leak characteristics and good breakdown voltage characteristics can be formed.

In the method of manufacturing the semiconductor device of a preferred aspect of the invention, the second insulating layer in the capacitor insulating layer is not exposed, so that generation of the leak current between the capacitor electrodes, which may be caused by damage, is prevented.

In the method of manufacturing the semiconductor device of another preferred aspect of the invention, heat treatment is effected on the lower electrode layer, so that generation of the leak current between the capacitor electrodes, which may be caused by damage, is prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

forming a conductive region at a main surface of a semiconductor substrate;

forming a first insulating layer covering said conductive region and having a hole extending from a top surface of said first insulating layer and reaching a surface of said conductive region;

forming a lower electrode layer on the top surface of said first insulating layer to be connected electrically with said conductive region through said hole;

forming on said lower electrode layer a capacitor insulating layer including a high permittivity dielectric material;

forming a mask having a configuration on said capacitor insulating layer;

patterning, by selectively removing, said capacitor insulating layer and said lower electrode layer using said mask to expose at least a sidewall surface of said lower electrode layer;

forming a second insulating layer on the top surface of said first insulating layer to cover said patterned lower electrode layer and said patterned capacitor insulating layer;

effecting anisotropic etching on said second insulating layer to form a sidewall insulating layer covering the sidewall surface of said lower electrode layer; and forming an upper electrode layer on said capacitor insulating layer and said sidewall insulating layer to cover said lower electrode layer.

2. The method of manufacturing the semiconductor device according to claim 1, wherein said anisotropic etching effected on said second insulating layer leaves said sidewall insulating layer on the sidewall surface and the top surface of said capacitor insulating layer, and said upper electrode layer is formed on said sidewall insulating layer.

3. The method of manufacturing the semiconductor device according to claim 1, further comprising the step of effecting heat treatment on said lower electrode layer after said sidewall insulating layer is formed, wherein said upper electrode layer is formed after said heat treatment.

* * * * *